(12) United States Patent
Furukawa et al.

(10) Patent No.: US 7,071,047 B1
(45) Date of Patent: Jul. 4, 2006

(54) METHOD OF FORMING BURIED ISOLATION REGIONS IN SEMICONDUCTOR SUBSTRATES AND SEMICONDUCTOR DEVICES WITH BURIED ISOLATION REGIONS

(75) Inventors: Toshiharu Furukawa, Essex Junction, VT (US); Mark C. Hakey, Fairfax, VT (US); Steven J. Holmes, Guilderland, NY (US); David V. Horak, Essex Junction, VT (US); Charles W. Koburger, III, Delmar, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 10/905,980

(22) Filed: Jan. 28, 2005

(51) Int. Cl.
*H01L 21/336* (2006.01)
(52) U.S. Cl. .................. 438/197; 438/637; 438/198; 257/78
(58) Field of Classification Search ............... None
See application file for complete search history.

(56) References Cited

U.S. PATENT DOCUMENTS

| 5,298,773 | A | 3/1994 | Woodruff |
| 5,338,571 | A | 8/1994 | Mirkin et al. |
| 5,751,018 | A | 5/1998 | Alivisatos et al. |
| 6,221,737 | B1 | 4/2001 | Letavic et al. |
| 6,251,751 | B1 | 6/2001 | Chu et al. |
| 6,376,285 | B1 | 4/2002 | Joyner et al. |
| 6,506,660 | B1 | 1/2003 | Holmes et al. |
| 6,579,463 | B1 | 6/2003 | Winningham et al. |
| 2003/0038323 | A1 | 2/2003 | Kotani |
| 2003/0040185 | A1 | 2/2003 | Jun et al. |
| 2003/0189231 | A1 | 10/2003 | Clevenger et al. |
| 2004/0082146 | A1 | 4/2004 | Ohmi et al. |
| 2005/0170554 | A1* | 8/2005 | Griglione et al. ........... 438/104 |

FOREIGN PATENT DOCUMENTS

| JP | 5090396 A | 4/1993 |
| JP | 7263538 A | 10/1995 |

OTHER PUBLICATIONS

Controlled Attachment of Pamam Dendrimers to Solid Surfaces, by C. A. Fail et al., 2002 American Chemical Society, published on the Web Dec. 6, 2001, 5 pages.
Self-Assembled Monolayers of CdSe Nanocrystals on Doped GaAs Substrates, by Eike Marx et al., 2002 American ChemicalSociety, Published on the WebJul. 11, 2002, 4 pages.
Fluorine Etching on the Si(1 1 1)—7×7 Surfaces Using Fluorinated Fullerene, by Y. Fujukawa et al., in *Surface Science*, vol. 521, Issue 1-2, Dec. 10, 2002, 8 pages.

(Continued)

*Primary Examiner*—Thao P. Le
(74) *Attorney, Agent, or Firm*—Schmeiser, Olsen & Watts; William D. Sabo

(57) ABSTRACT

Semiconductor structures and method of forming semiconductor structures. The semiconductor structures including nano-structures or fabricated using nano-structures. The method of forming semiconductor structures including generating nano-structures using a nano-mask and performing additional semiconductor processing steps using the nano-structures generated.

34 Claims, 15 Drawing Sheets

OTHER PUBLICATIONS

Formation of a Cobalt Magnetic Dot Array via Block Copolymer Lithography, by Joy Y. Cheng et al., *Adv. Mater.* 2001, 13, No. 15, Aug. 3, 5 pages.

Enabling Nanotechnology with Self Assembled Block Copolymer Patterns, by Cheolmin Park et al, 2003 *Elsevier Ltd.*, doi:10.1016/j.polymer.2003.08.011, 36 pages.

* cited by examiner

METHOD OF FORMING BURIED ISOLATION REGIONS IN SEMICONDUCTOR SUBSTRATES AND SEMICONDUCTOR DEVICES WITH BURIED ISOLATION REGIONS

FIELD OF THE INVENTION

The present invention relates to the field of integrated circuit manufacture; more specifically, it relates to methods of forming buried isolation regions in semiconductor substrates and methods of forming semiconductor devices with buried isolation.

BACKGROUND OF THE INVENTION

Conventional methods of fabricating silicon on insulator (SOI) substrates, such as subjecting silicon wafers to oxygen ion implantation or oxygen plasmas suffer from relatively high defect levels in the buried oxide (BOX) layer so formed. Additionally, for some applications the buried oxide layer inhibits optimum operation of devices formed in the silicon layer. Therefore, there is a need for improved methods of forming buried isolation regions in semiconductor substrates and for methods of forming semiconductor devices with buried isolation and still provide optimum operation of the devices.

SUMMARY OF THE INVENTION

The present invention utilizes nano-masking techniques to create nano-openings in specific regions of a semiconductor substrate or an insulating layer on the semiconductor substrate. Various semiconductor processes are then performed using the nano-openings to generate or modify a buried insulating layer in the semiconductor substrate.

A first aspect of the present invention is a method of forming a semiconductor structure, comprising: (a) providing a single crystal silicon substrate; (b) forming a hard mask layer on a top surface of the substrate; (c) forming a nano-mask layer on a top surface of the hard mask layer without performing a photolithographic process, the nano-mask layer having a masking pattern; (d) etching the masking pattern into the hard mask layer to form a patterned hard mask layer having openings, the openings extending from a top surface of the patterned hard mask layer to the top surface of the substrate, wherein the openings, distances between the openings, or both the openings and the distances between the openings independently have at least one spatial extent extending parallel to the top surface of the patterned hard mask layer; and (e) after removing the nano-mask layer, forming a single crystal group IV semiconductor layer on a top surface of the patterned hard mask layer, the single crystal group IV semiconductor layer filling the openings in the patterned hard mask layer.

A second aspect of the present invention is a method of forming a semiconductor structure, comprising: (a) providing a single crystal silicon substrate; (b) forming a dummy gate on a top surface of the substrate; (c) forming a nano-mask layer on a top surface of the substrate and on a top surface of the dummy gate without performing a photolithographic process, the nano-mask layer having a masking pattern; (d) etching the masking pattern into the substrate wherever the substrate is not covered by the dummy gate to form a patterned silicon region having openings in the substrate, the openings extending from a top surface of the substrate a predetermined distance into the substrate, wherein the openings, distances between the openings, or both the openings and the distances between the openings independently have at least one spatial extent extending parallel to the top surface of the patterned layer; (e) after removing the nano-mask layer, forming a protective layer on the top surface of the substrate and on sidewalls of the openings; (f) oxidizing the substrate exposed in bottoms of the openings to form a buried patterned silicon dioxide layer; g) removing the protective layer from the sidewalls of the openings; and (h) filling the openings with a single crystal group IV semiconductor material.

A third aspect of the present invention is a method of forming a semiconductor structure, comprising: (a) providing a single crystal silicon substrate; (b) forming a dummy gate on a top surface of the substrate; (c) forming a nano-mask layer on a top surface of the substrate and on a top surface of the dummy gate without performing a photolithographic process, the nano-mask layer having a masking pattern; (d) etching the masking pattern into the substrate wherever the substrate is not covered by the dummy gate to form openings in the substrate, the openings extending from a top surface of the substrate a predetermined distance into the substrate, wherein the openings, distances between the openings, or both the openings and the distances between the openings independently have at least one spatial extent extending parallel to the top surface of the patterned layer; and (e) annealing the substrate to reflow silicon adjacent to the top surface of the substrate, sealing off the openings from the top surface of the substrate and coalescing the openings into buried voids.

A fourth aspect of the present invention is a semiconductor structure, comprising: a substrate comprising a silicon lower layer, a patterned buried oxide layer on a top surface of the silicon lower layer, the patterned buried oxide layer having openings, the openings extending through the patterned oxide layer and filled with a single crystal group IV semiconductor material and a single crystal group IV semiconductor layer on top of the patterned buried oxide layer, wherein a width of the openings, a distance between the openings, or both the width of the openings and the distances between the openings independently have at least one spatial extent less than a photolithographic definable dimension, the at least one spatial extent extending parallel to a top surface of the substrate; a gate dielectric on the top surface of the silicon substrate; a gate electrode on a top surface of the gate dielectric; and a source and a drain in the substrate and on opposite sides of the gate electrode.

A fifth aspect of the present invention is a semiconductor structure, comprising: a silicon substrate; a gate dielectric on a top surface of the silicon substrate; a gate electrode on a top surface of the gate dielectric; a source and a drain in the substrate and on opposite sides of the gate electrode; and a first void or group of voids in the substrate under the source and a second void or group of voids in the substrate under the drain.

BRIEF DESCRIPTION OF DRAWINGS

The features of the invention are set forth in the appended claims. The invention itself, however, will be best understood by reference to the following detailed description of an illustrative embodiment when read in conjunction with the accompanying drawings, wherein:

DETAILED DESCRIPTION OF THE INVENTION

All of the nano-mask layers utilized by the present invention are formed without photolithographic processing. A photolithographic process is one in which a pattern is formed in a photoresist layer by exposing the resist layer to energy that will create a pattern in the resist layer through either a photo-mask using light wavelength radiation (i.e. visible or ultra-violet) or X-ray radiation, or by direct write (i.e. without a mask) of the pattern into the photoresist with an electron beam. An image development process step is often required as well in photolithographic processing. Nano-mask layers often have patterns wherein one or more of the features of the pattern (i.e. a opening width, an island width, a distance between islands or a distance between openings) have a dimension that is less than that obtainable by conventional photolithographic processes. These dimensions are specified as being in the "nanometer" range and, in one example, are between about 2 nm to about 100 nm.

Figure 1A:
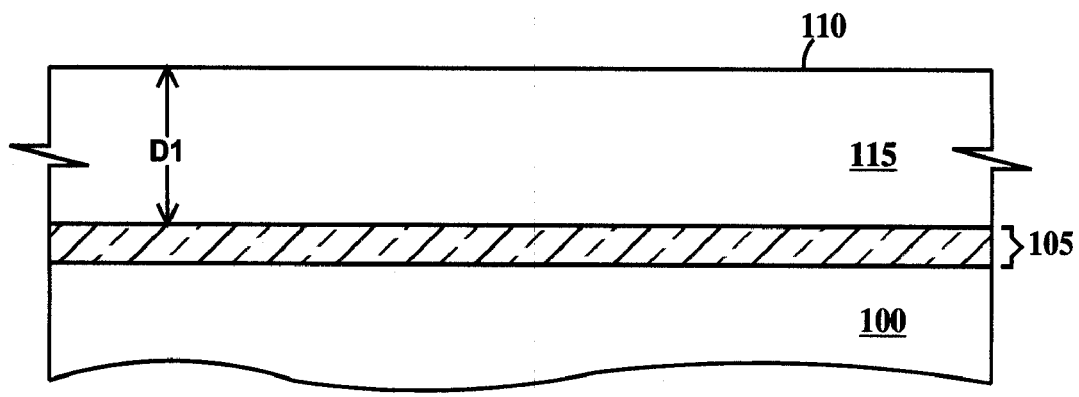
FIGS. 1A through 1H are partial cross-sectional views illustrating the steps to form a buried isolation region in a semiconductor substrate according to a first embodiment of the present invention.

FIGS. 1A through 1H are partial cross-sectional views illustrating the steps to form a buried isolation region in a semiconductor substrate according to a first embodiment of the present invention. In FIG. 1A, a silicon substrate 100 has been exposed to a high power oxygen implantation to create an oxygen rich layer 105 a distance D1 from a top surface 110 of substrate 100 into the substrate. Oxygen rich layer 105 defines an upper portion of silicon substrate 100 as a silicon layer 115 between the oxygen rich layer and the top surface of the substrate. Oxygen rich layer 105 may contain regions of silicon dioxide. As the exact stoichiometry of oxides of silicon can vary somewhat in semiconductor structures, for the purposes of the present invention, the term silicon dioxide includes compounds of silicon and oxygen having the specific formulas $SiO_2$ as well as the general formula $Si_xO_y$. In one example, distance D1 is about 20 nm to about 100 nm.

Figure 1B:
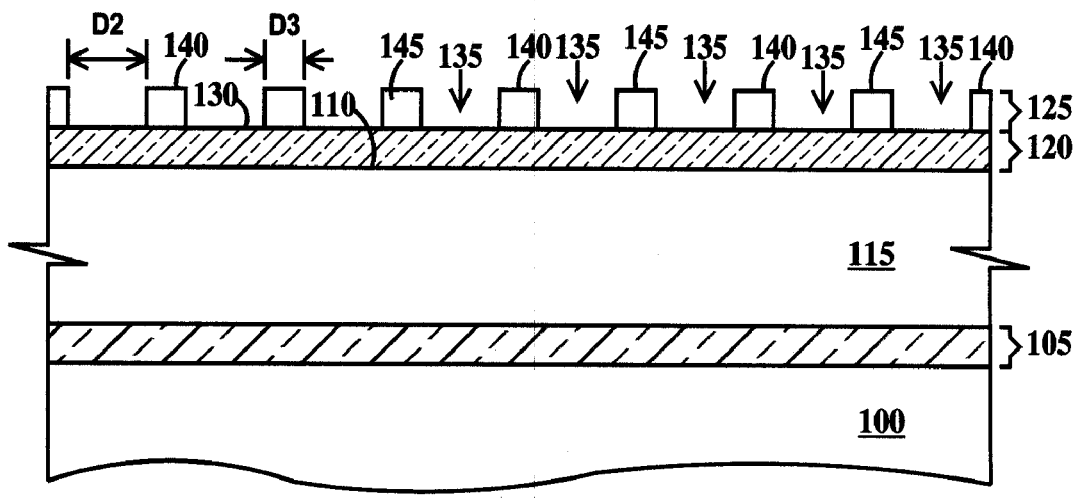

In FIG. 1B, a hard mask layer 120 is formed on top surface 110 of substrate 100. In one example, hard mask layer 120 comprises silicon nitride about 50 nm thick. A nano-mask 125 is formed on a top surface 130 of hard mask layer 120. Nano-mask layer 125 comprises void regions 135 extending from a top surface 140 of nano-mask layer 125 to top surface 130 of hard mask layer 120 and solid regions 145. In a first example void regions 135 are holes in a continuous solid region 145. In a second example, solid regions 145 are islands surrounded by void region 135. Void regions 135 have at least one spatial extent of dimension D2 in a direction parallel to top surface 110 of substrate 100 and solid regions 145 have at least one spatial extent of dimension D3 in a direction parallel to top surface 110 of substrate 100. In a first example, D2 and D3 are each independently between about 2 nm and about 100 nm. In a second example, D2 and D3 are each independently between about 2 nm and about 50 nm.

Two examples of methods of forming layers that may be used as nano-mask are as follows. The first method of forming nano-mask layers utilizes block copolymers. Block copolymers include two or more chemically distinct polymer chains covalently linked to form a single molecule. Owing to mutual repulsion, block copolymers tend to segregate into different domains and self-organized microstructures emerge from which one copolymer can be selectively removed. The second method of forming nano-mask layers utilizes nano-crystals.

In a first block copolymer example, a polymethylmethacrylate (PMMA) in polystyrene (PS) copolymer is spin applied on a surface and then heated to between about 100° C. to about 400° C. to drive off the PMMA polymer or portions thereof in order to form a nano-mask layer. Alternatively, the PMMA can be removed by use of a solvent that preferentially dissolves PMMA over PS. Prior to removal of the PMMA, the PMMA/PS copolymer layer may be vertically orientated into cylindrical domains perpendicular the to the surface which the PMMA/PS copolymer has been applied in an electric field.

In a second block copolymer example a PMMA/PS copolymer layer can be made to self-assemble into a hexagonally packed array of PMMA cylinders in a polystyrene matrix. The PMMA cylinders can be made to orient normal to the plane of the film by, among other known means, spin-coating a dilute polymer solution in toluene, or other solvent, onto the substrate and annealing the resulting film. The PMMA cylinders are then removed by exposure to electron-beam or ultraviolet radiation and dissolution in acetic acid or other effective solvent. The resulting nano-mask layer typically has hexagonally packed holes about 20 nanometers in maximum width (or diameter). By controlling the molecular weights and relative ratios of the two polymer blocks, one can control the hole size range from about 2 nanometers up to about 100 nanometers and the hole separations from about 2 nanometers up to about 100 nanometers.

In a third block copolymer example, PS/polybutadiene (PB) block copolymer is used as a starting material for a nano-mask layer. The PS/PB block copolymer self-assembles into a hexagonally packed array of PB cylinders embedded in a PS matrix. The PB cylinders are made to orient normal to the plane of the nano-mask layer that will be produced by, among other known means, spreading a drop of dilute PS/PB block copolymer solution in toluene, or like solvent, onto the surface of a de-ionized water bath and allowing the toluene to evaporate. This leaves behind a film typically about 100 to about 200 nm thick, which may then be deposited upon a surface to be nano-masked. The PB cylinders are then removed by annealing and reaction with ozone, which reacts more rapidly with the PB than with the PS, thereby leaving behind a nano-mask layer with holes typically about 13 nm in maximum width (or diameter. By controlling the molecular weights of the copolymers, one can control the hole size to range from about 2 to about 100 nanometers in maximum width (or diameter) and spaced from about 2 to about 100 nanometers apart.

In a fourth block copolymer example, a PS/PB block copolymer layer (as described in the third block copolymer example supra) is treated with $OSO_4$ which selectively binds to the PB cylinders. This now causes ozone to attack the PS component at a faster rate than PB, thereby leaving behind a pattern of islands instead of holes.

In a fifth block-copolymer example, a PS/polyisoprene (PI) block copolymer is used. The PS/PI block copolymer is similar to the PS/PB block copolymer described in the third and fourth block-copolymer examples supra, except that the PI self-assembles into spheres instead of cylinders. Hence, there is no need to orient the PI component normal to the plane of the nano-mask layer that will be produced. PS-PI films may also be treated with $OSO_4$ to create an inverted pattern.

In a sixth block-copolymer example, a PS/poly(styrene-b-ferrocenyldimethysiliane) (PFS) block copolymer is spin applied and the PS removed by oxygen reactive ion etching (RIE) to form islands of PFS.

In a first nano-crystal example, a polymaleic anhydride polymer layer is pulse plasma deposited on a surface to be nano-masked, The polymer surface is then treated with an alkanethiol solution such as a mixture of about 0.0008% by volume 1,6-hexanedithiol, about 12% by volume aqueous ammonia (35% by weight) and about 88% by volume 2-propanol in darkness at room temperature. After rinsing, the treated surface is immersed in a toluene solution containing about 0.016% by weight CdSe nano-crystals in darkness at room temperature during which time CdSe nano-crystals attach to the treated surface. In one example, CdSe nano-crystals of about 2.4 to about 4 nm may be used.

In a second nano-crystal example, CdS nano-crystals are substituted for CdSe nano-crystals.

While several examples of nano-mask preparation have been given, any nano-mask layer comprising islands of material about 2 nm to about 100 nm in width (or diameter) spaced about 2 nm to about 100 nm apart or comprising a material having voids, extending from a top surface to a bottom surface of the nano-mask layer, about 2 nm to about 100 nm in width (or diameter) and spaced about 2 nm to about 100 nm apart may be used to practice the present invention provided the material is sufficiently resistant to the etch process that will transfer the nano-mask pattern into an underlying material may be used.

Figure 1C:
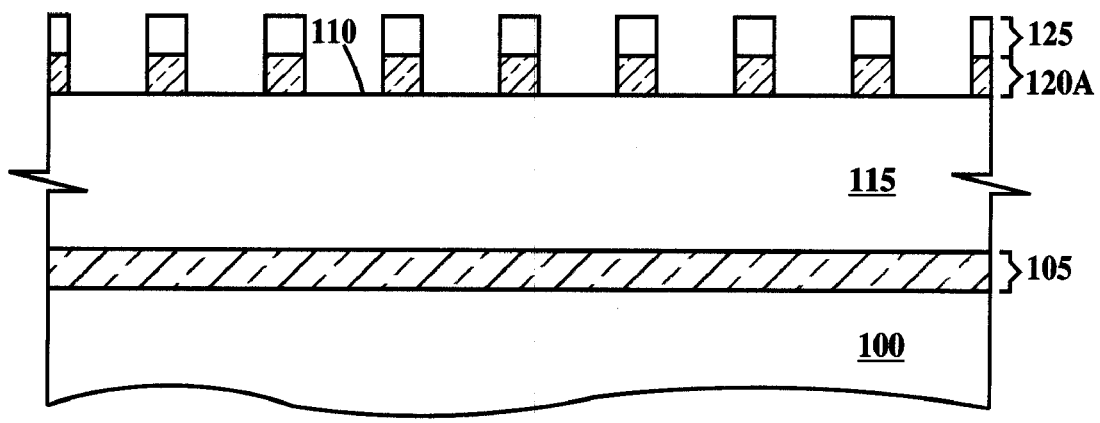

In FIG. 1C, hard mask layer 120 (see FIG. 1B) is removed (for example by a RIE process) to form a patterned hard mask layer 120A and expose silicon substrate 100 wherever the hard mask layer is not protected by patterned nano-mask layer 125. The nano-mask layer pattern is thus transferred to the hard mask layer.

Figure 1D:
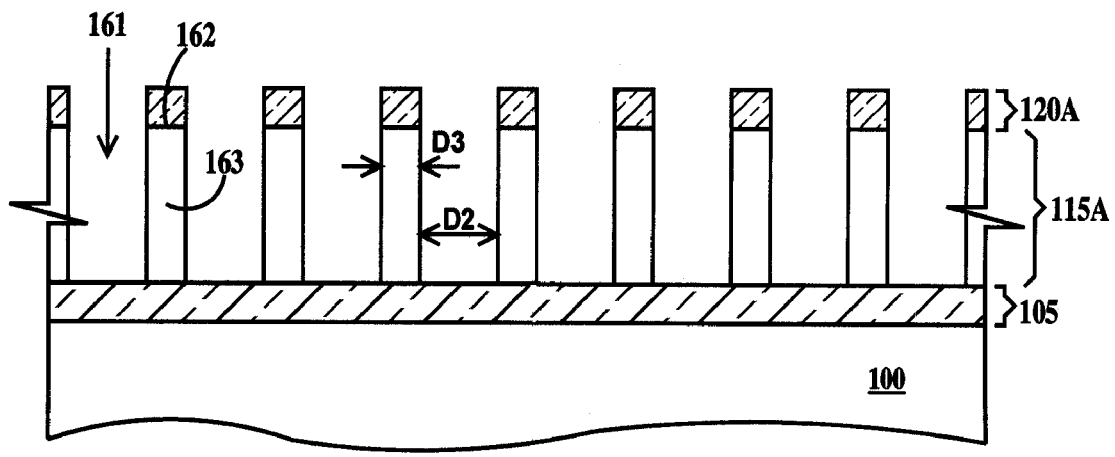

In FIG. 1D, nano-mask layer 125 (see FIG. 5C) is removed and a patterned silicon layer 115A is formed (for example by RIE stopping on oxygen rich layer 105) wherever silicon layer 115 (see FIG. 1C) was not protected by patterned hard mask layer 120A. Patterned silicon layer 115A comprises void regions 161, extending from a top surface 162 of patterned silicon layer 115A to oxygen rich layer 105, and solid regions 163. In a first example void regions 161 are holes in a continuous solid region 163. In a second example, solid regions 163 are islands surrounded by void region 161. Void regions 161 have at least one spatial extent of dimension D2 in a direction parallel to top surface 162 of solid regions 163 and solid regions 163 have at least one spatial extent of dimension D3 in a direction parallel to top surface 162 of solid region 163. Values for D2 and D3 have been described supra.

Figure 1E:
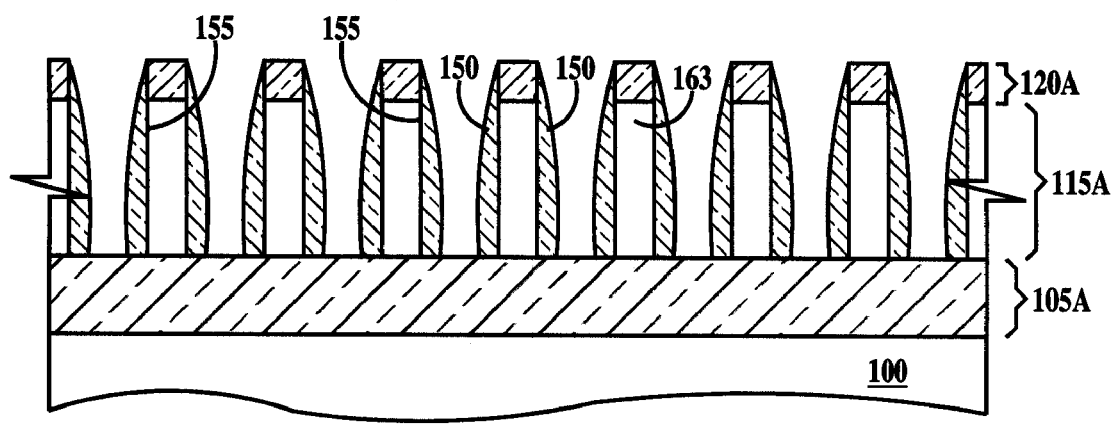

In FIG. 1E, silicon nitride spacers 150 are formed on exposed sidewalls 155 of solid regions 163. Spacers 150 may be formed by deposition of a conformal silicon nitride layer followed by an RIE selective to etch silicon nitride over silicon dioxide and silicon. In one example, the conformal silicon nitride layer is between about 2 nm and about 5 nm thick. After formation of spacers 150, a thermal oxidation is performed to transform oxygen rich layer 105 (see FIG. 1D) into a buried oxide layer 105A. In one example thermal oxidation is performed in an oxygen, water vapor or oxygen/water vapor atmosphere at about 1000° C. to about 1200° C. for about 10 milliseconds to about 600 seconds.

Figure 1F:
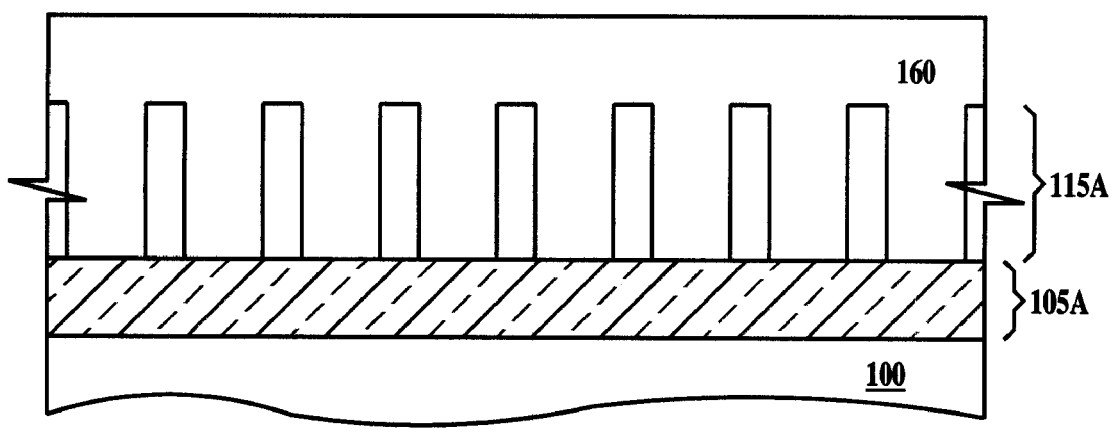

In FIG. 1F, patterned hard mask layer 120A (see FIG. 1E) and spacers 150 (see FIG. 1E) are removed and a single crystal group IV semiconductor layer 160 is formed. Group IV semiconductor layer 160 may comprise silicon, germanium or a mixture of silicon germanium denoted by the formula $Si_xGe_y$ where x=0 to 1 and y=1-x. When x=0, group IV semiconductor layer 160 contains germanium but no silicon. When x=1, group IV semiconductor layer 160 contains silicon but no germanium. In one example, poly-$Si_xGe_y$ is deposited and converted to a single crystal layer by annealing in hydrogen at about 850° C. using patterned silicon layer 115A as a seed layer. A single crystal silicon seed (layer) allows (at relatively high temperatures such as used during epitaxial deposition or during 850° C. or higher temperature anneals) the silicon seed (layer) and silicon deposited on the silicon seed (layer) to coalesce into a single silicon layer having the same single crystal structure as the silicon seed (layer) had. In another example, epitaxial $Si_xGe_y$ is grown using patterned silicon layer 115A as a seed layer followed by a hydrogen anneal at about 850° C. In both examples a relatively defect free group IV semiconductor layer 160 over relatively defect free buried oxide layer 105A results, however, the epitaxial example generally produces a more defect free $Si_xGe_y$ layer. Alternatively, a combination laser anneal and thermal anneal in hydrogen may be performed.

Figure 1G:
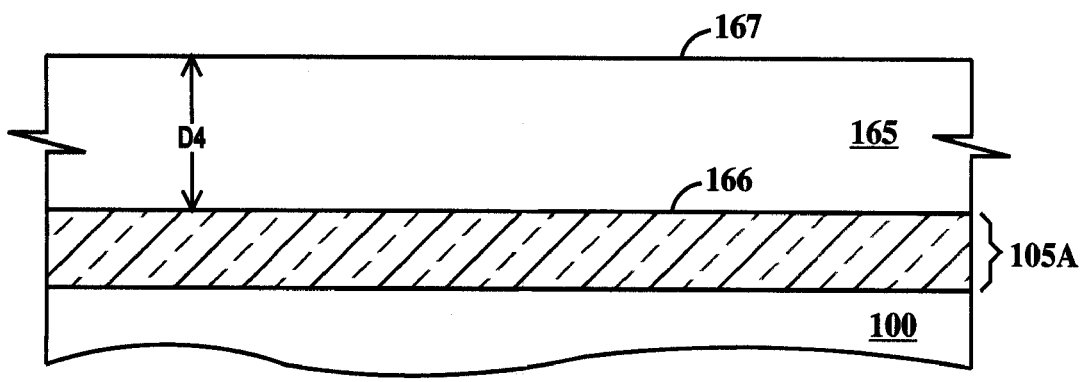

In FIG. 1G, the anneals performed supra relative to FIG. 1F result in patterned silicon layer 115A (see FIG. 1F) and group IV semiconductor layer 160 (see FIG. 1F) coalescing into a single layer having the same single crystal structure as silicon layer 115 (see FIG. 1A) had. A chemical-mechanical-polish (CMP) of group IV semiconductor layer 160 (see FIG. 1F) is performed to form a single crystal group IV semiconductor layer 165. If single crystal group IV semiconductor layer 160 (see FIG. 1F) contained germanium, then single crystal group IV semiconductor layer 165 will contain silicon and germanium. A top surface 166 of buried oxide layer 105A is a distance D4 below a top surface 167 of group IV semiconductor layer 165. In one example D4 is about 20 nm to about 300 nm. Thus, a silicon-on-insulator (SOI) substrate has been fabricated.

Figure 1H:
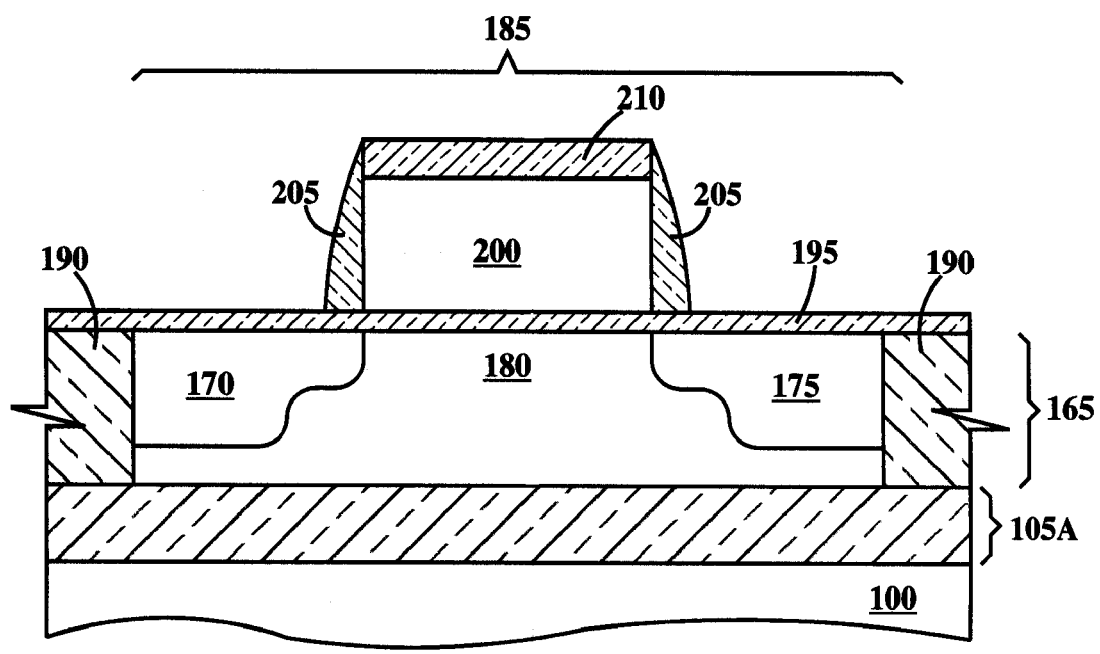

In FIG. 1H, a source 170, drain 175 and channel region 180 of a field effect transistor (FET) 185 have been formed in group IV semiconductor layer 165. Trench isolation 190 has also been formed in group IV semiconductor layer 165. A gate dielectric 195 and a gate electrode have been formed over channel region 180. Gate electrode 200 is illustrated with optional insulating sidewall spacers 205 and an insulating capping layer 210.

Figure 2A:
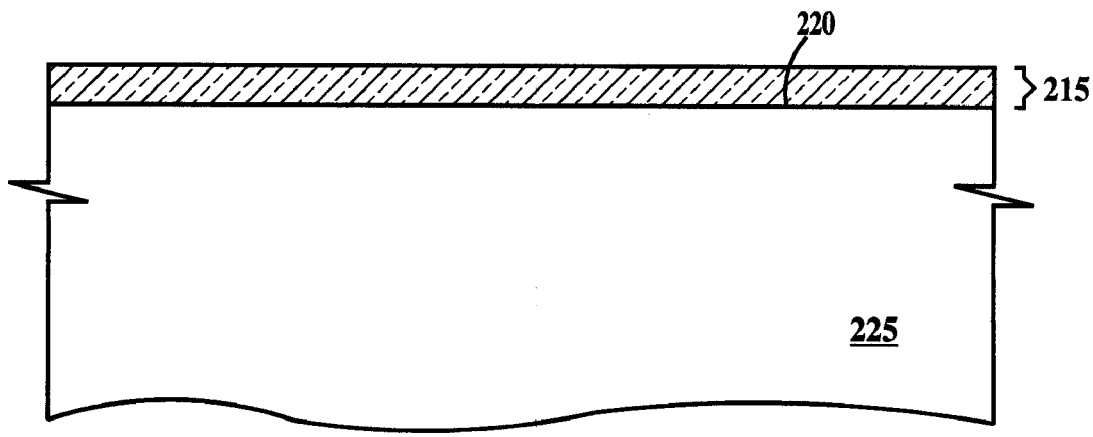
FIGS. 2A through 2E are partial cross-sectional views illustrating the steps to form a buried isolation region in a semiconductor substrate according to a second embodiment of the present invention.

FIGS. 2A through 2E are partial cross-sectional views illustrating the steps to form a buried isolation region in a semiconductor substrate according to a second embodiment of the present invention. In FIG. 2A, a silicon dioxide layer 215 is formed on a top surface 220 of a silicon substrate 225. In one example silicon dioxide layer 215 is about 5 nm to about 100 nm thick.

Figure 2B:
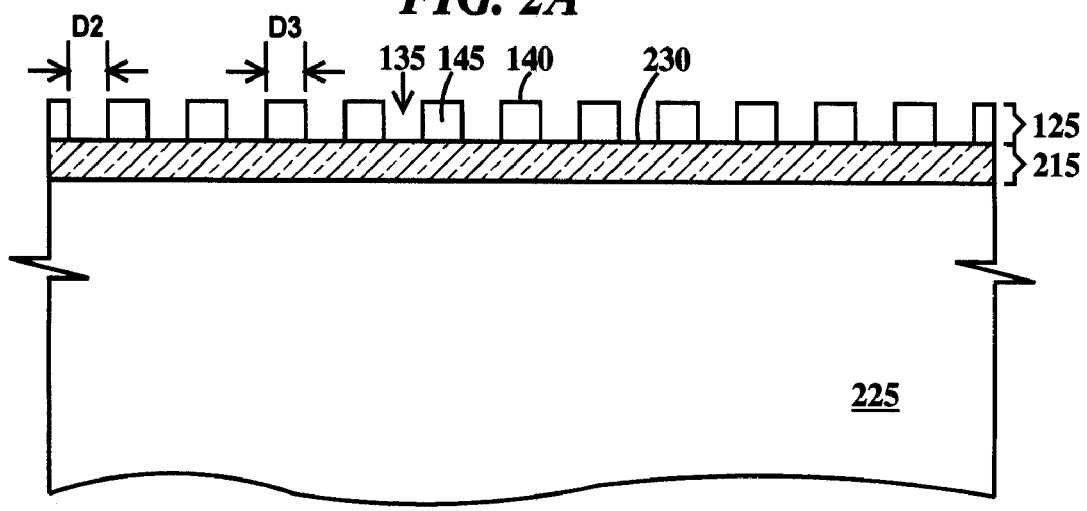

In FIG. 2B, nano-mask layer 125 is formed on top surface 230 of silicon dioxide layer 215. Nano-mask layer 125 has been described supra in relationship to the first embodiment of the present invention.

Figure 2C:
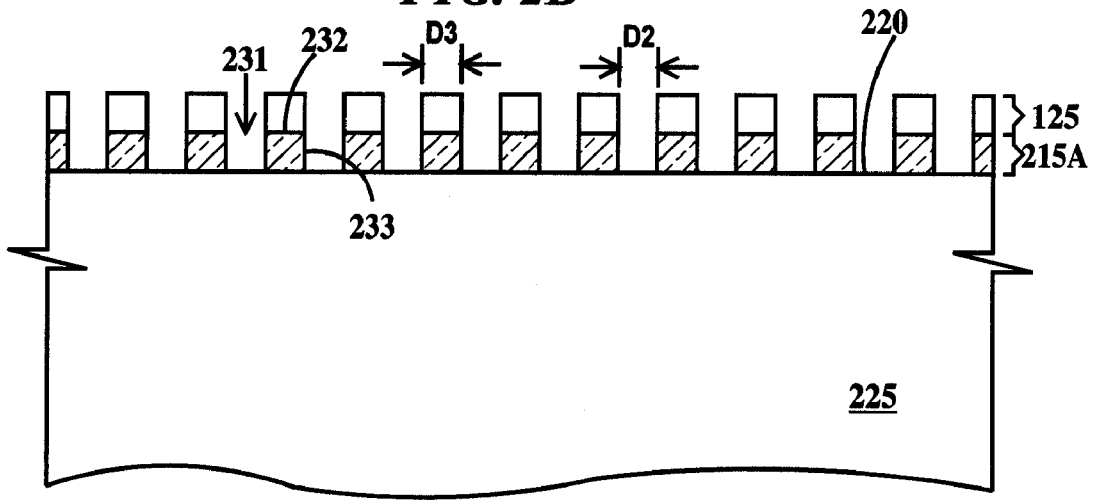

In FIG. 2C, silicon dioxide layer 215 (see FIG. 2B) is removed (for example by a RIE process) to form a patterned silicon dioxide layer 215A and exposing silicon substrate 225 wherever the silicon dioxide layer 215 is not protected by nano-mask layer 125. Patterned silicon dioxide layer 215A comprises void regions 231 extending from a top surface 232 of patterned silicon layer 215A to top surface 220 of substrate 225 and solid regions 233. In a first example void regions 231 are holes in a continuous solid region 233. In a second example, solid regions 233 are islands surrounded by void region 231. Void regions 231 have at least one spatial extent of dimension D2 in a direction parallel to top surface 232 of solid regions 233 and solid regions 233 have at least one spatial extent of dimension D3 in a direction parallel to top surface 232 of solid region 233. Values for D2 and D3 have been described supra.

Figure 2D:
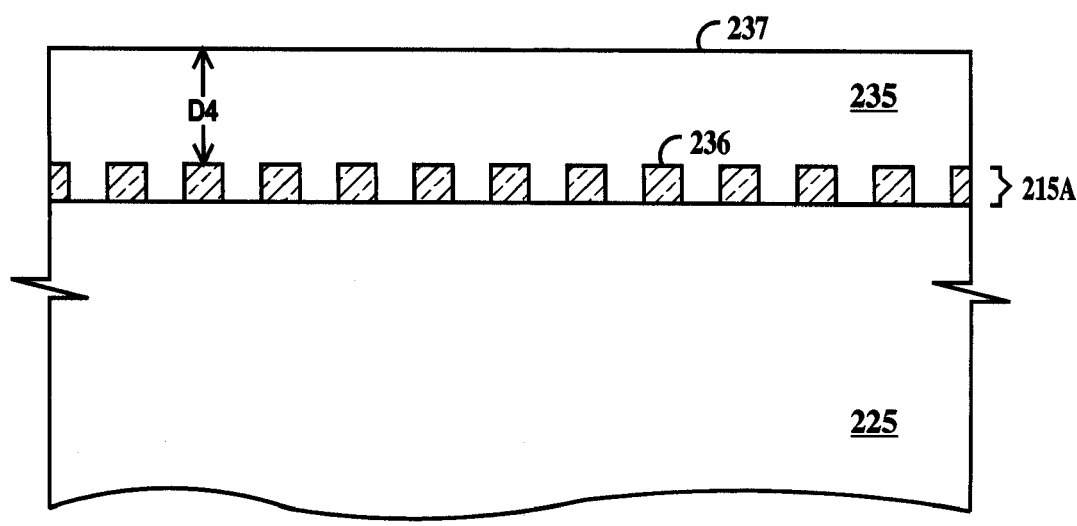

In FIG. 2D, nano-mask layer 125 (see FIG. 2C) is removed and single crystal group IV semiconductor layer 235 is formed using exposed silicon substrate 225 as a seed. Group IV semiconductor layer 235 may comprise silicon, germanium or a mixture of silicon germanium denoted by the formula $Si_xGe_y$, where x=0 to 1 and y=1-x. When x=0, group IV semiconductor layer 235 contains germanium but no silicon. When x=1, group IV semiconductor layer 235 contains silicon but no germanium. In one example, poly-$Si_xGe_y$ is deposited and converted to a single crystal layer by annealing in hydrogen at about 850° C. followed by a CMP. In another example, epitaxial $Si_xGe_y$ is grown using patterned silicon layer 215A as a seed layer followed by annealing in hydrogen at about 850° C. followed by a CMP. Again, the epitaxial example generally produces a more defect free silicon layer. Alternatively, a combination laser anneal and thermal anneal in hydrogen may be performed. A top surface 236 of patterned buried oxide layer 215A is a distance D4 below a top surface 237 of group IV semiconductor layer 235. In one example D4 is about 20 nm to about 300 nm. Thus, a silicon-on-insulator (SOI) or $Si_xGe_y$-on-insulator substrate has been fabricated, though the insulator portion is not continuous.

Figure 2E:
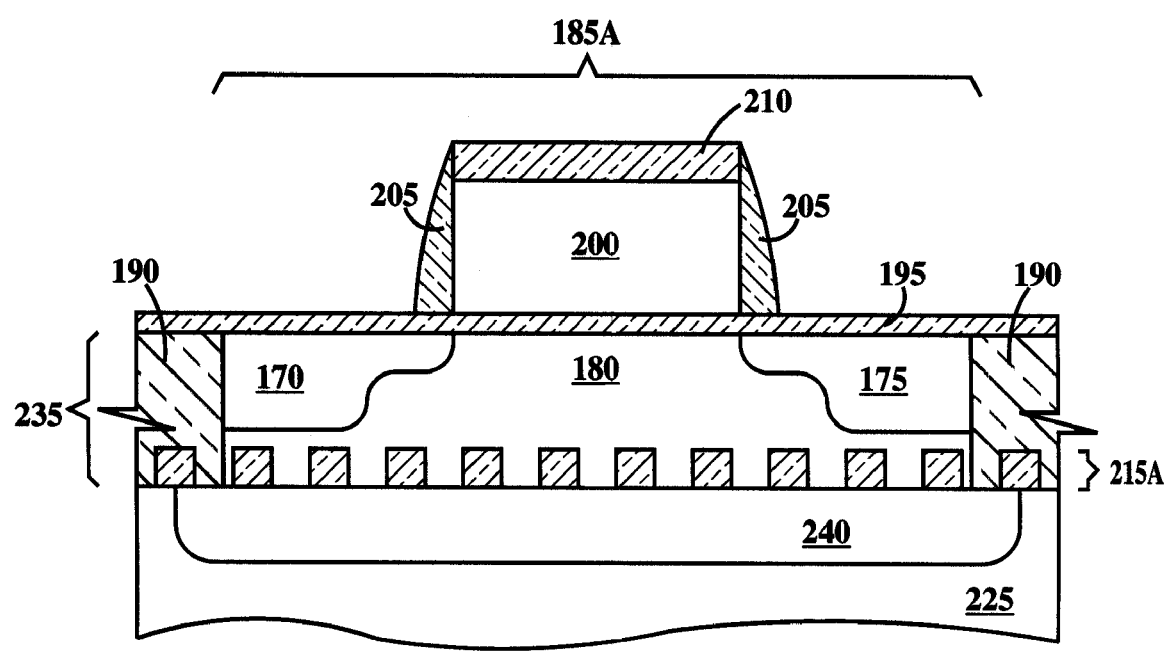

In FIG. 2E, source 170, drain 175 and channel region 180 of a FET 185A have been formed in group IV semiconductor layer 235. Trench isolation 190 has also been formed in group IV semiconductor layer 235. An optional well 240 has been formed in substrate 225. Wells are regions of substrates doped, for example, by ion implantation in which the diffused portions of FETs are fabricated. Optional well 240 may extend part way under trench isolation 190. Gate dielectric 195 and gate electrode 200 have been formed over channel region 180. Gate electrode 200 is illustrated with optional insulating sidewall spacers 205 and insulating capping layer 210. The openings in silicon dioxide layer 215A allow direct contact between group IV semiconductor layer 235 and substrate 225, thus providing improved cooling and body potential control of FET 185A.

Figure 3A:
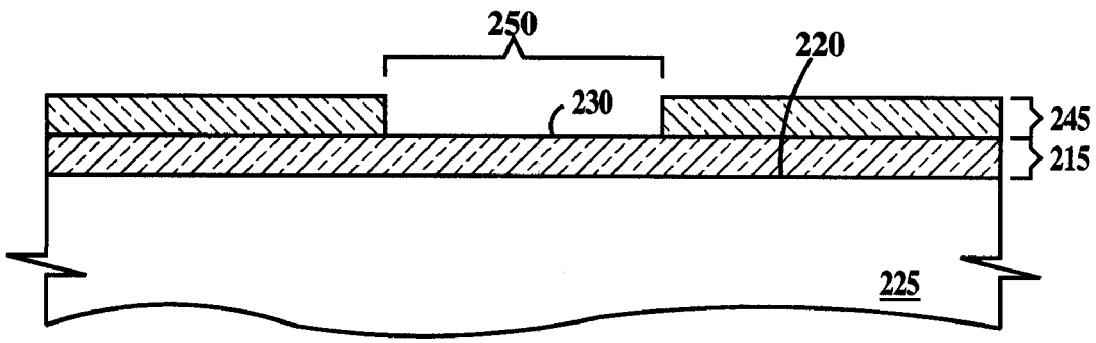
FIGS. 3A through 3E are partial cross-sectional views illustrating the steps to form a buried isolation region in a semiconductor device in a semiconductor substrate according to a third embodiment of the present invention.

FIGS. 3A through 3E are partial cross-sectional views illustrating the steps to form a buried isolation region in a semiconductor device in a semiconductor substrate according to a third embodiment of the present invention. In FIG. 3A, silicon dioxide layer 215 is formed on a top surface 220 of a silicon substrate 225. In one example, silicon dioxide layer 215 is about 5 nm to about 100 nm thick. A silicon nitride layer 245 is formed on top surface 230 of silicon dioxide layer 215. In one example, silicon nitride layer 245 is about 50 nm to about 100 nm thick. An opening 250 is formed in silicon nitride layer 245 exposing silicon dioxide layer 215 in the opening.

Figure 3B:
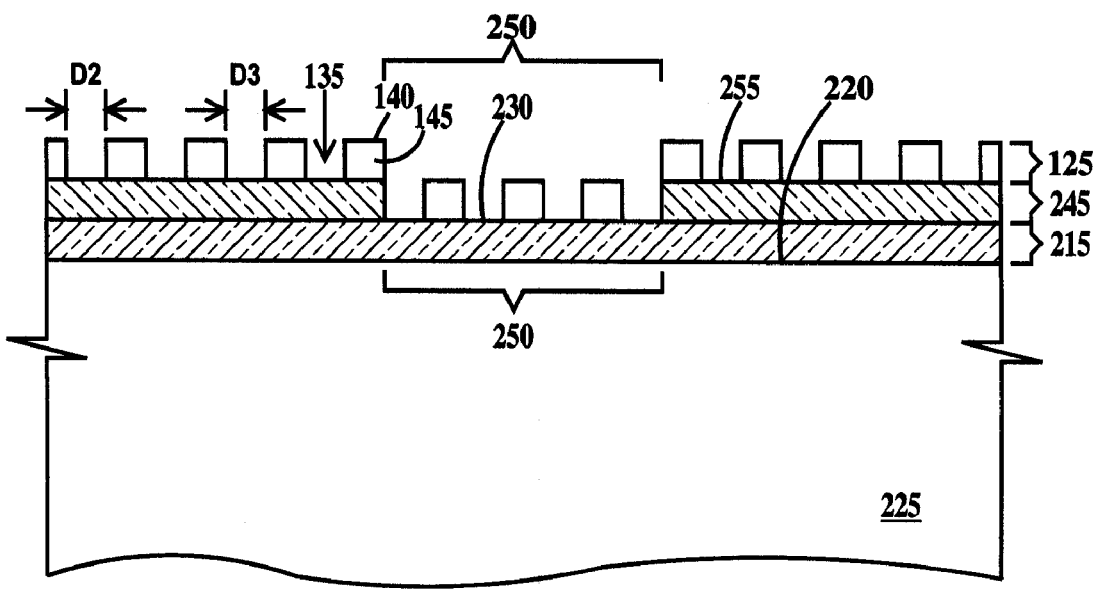

In FIG. 3B, nano-mask 125 is formed on a top surface 230 of silicon dioxide layer 215. Nano-mask layer 125 has been described supra in relationship to the first embodiment of the present invention.

Figure 3C:
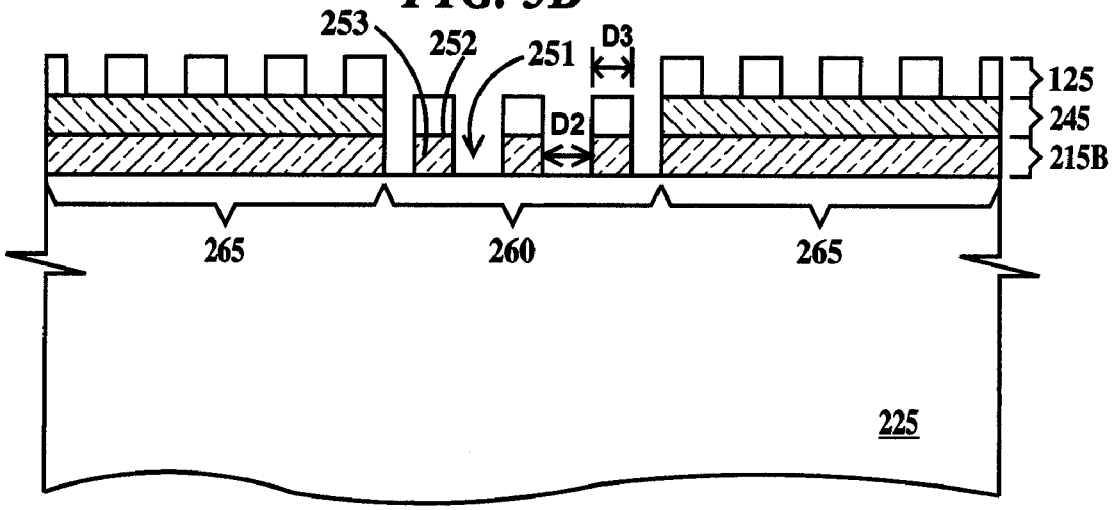

In FIG. 3C, silicon dioxide layer 215 (see FIG. 3B) is removed (for example by a RIE process selective to silicon nitride) to form a patterned silicon dioxide layer 215B and exposing silicon substrate 225 wherever the silicon dioxide layer is not protected by nano-mask layer 125. Patterned silicon dioxide layer 215B comprises void regions 251 extending from a top surface 252 of patterned silicon layer 215B to top surface 220 of substrate 225 and solid regions 253. In a first example void regions 251 are holes in a continuous solid region 253. In a second example, solid regions 253 are islands surrounded by void region 251. Void regions 251 have at least one spatial extent of dimension D2 in a direction parallel to top surface 232 of solid regions 253 and solid regions 253 have at least one spatial extent of dimension D3 in a direction parallel to top surface 252 of solid region 253. Values for D2 and D3 have been described supra.

Figure 3D:
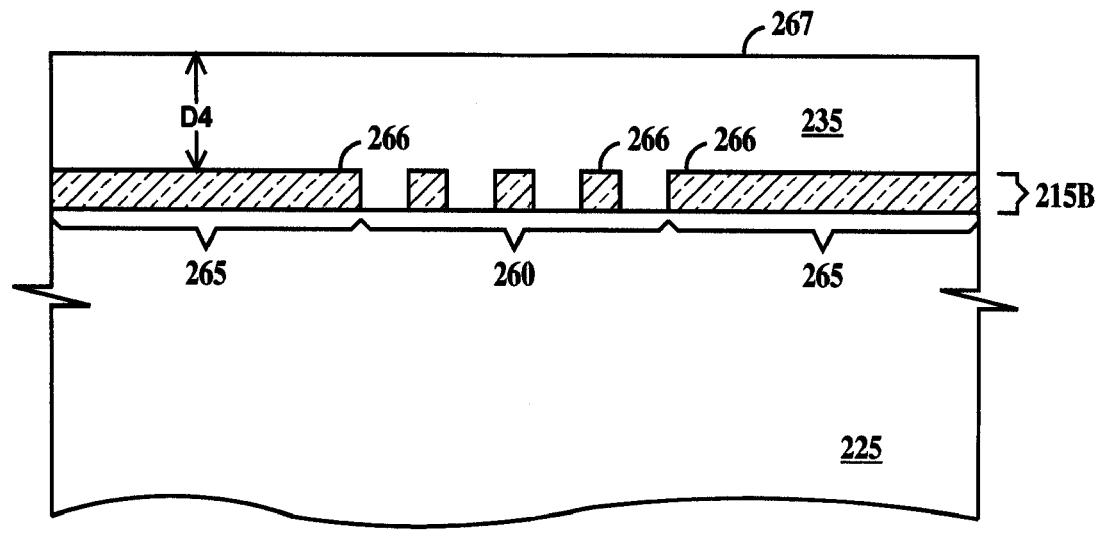

In FIG. 3D, nano-mask layer 125 (see FIG. 3C) and nitride layer 245 are removed and single crystal group IV semiconductor layer 235 is formed using exposed silicon substrate 225 as a seed. In one example, poly-$Si_xGe_y$ is deposited and converted to a single crystal layer by annealing in hydrogen at about 850° C. followed by a CMP. In another example, epitaxial $Si_xGe_y$ is grown using substrate 225 as a seed layer followed by annealing in hydrogen at about 850° C. followed by a CMP. Again, the epitaxial example generally produces a more defect free silicon layer. Alternatively, a combination laser anneal and thermal anneal in hydrogen may be performed. Top surface 266 of patterned buried oxide layer 215B is a distance D4 below a top surface 267 of group IV semiconductor layer 235. In one example D4 is about 20 nm to about 300 nm. Thus, a silicon-on-insulator (SOI) substrate has been fabricated, though the insulator portion is not continuous.

Figure 3E:
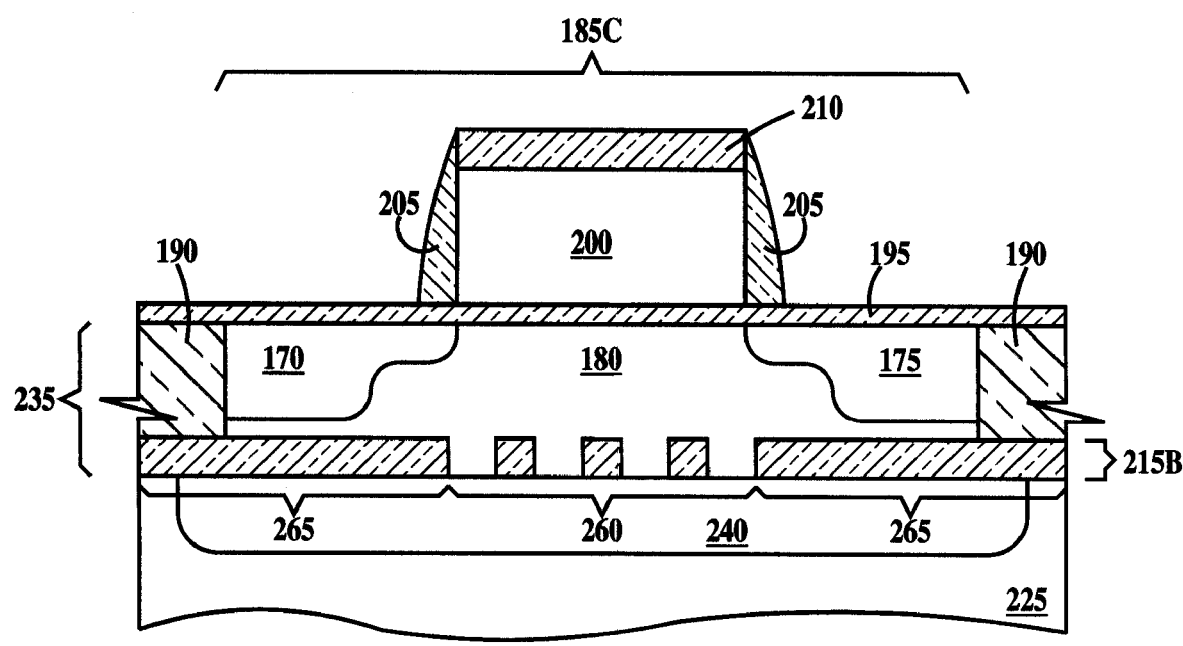

In FIG. 3E, source 170, drain 175 and channel region 180 of a FET 185C have been formed in group IV semiconductor layer 235. Source 170 and drain 175 are aligned over second regions 265 of patterned silicon dioxide layer 215B and channel region 180 and gate electrode 200 are aligned over (island or voided) first region 260 of patterned oxide layer 215B. Trench isolation 190 has also been formed in group IV semiconductor layer 235. An optional well 240 has been formed in substrate 225. Optional well 240 may extend part way under trench isolation 190 and is doped opposite to the doping type of substrate 225 and/or to a different doping concentration. Gate dielectric 195 and gate electrode 200 have been formed over channel region 180. Gate electrode 200 is illustrated with optional insulating sidewall spacers 205 and insulating capping layer 210. The openings in silicon dioxide layer 215B allow direct contact between group IV semiconductor layer 235 and substrate 225, thus providing improved cooling and body potential control of FET 185B. It should be noted that first region(s) 260 may extend partially under source 170 and/or drain 175 and that second region(s) 265 may extend partially under gate electrode 200.

Figure 4A:
FIGS. 4A through 4L are partial cross-sectional views illustrating the steps to form a buried isolation region in a semiconductor device in a semiconductor substrate according to a fourth embodiment of the present invention.

FIGS. 4A through 4L are partial cross-sectional views illustrating the steps to form a buried isolation region in a semiconductor device in a semiconductor substrate according to a fourth embodiment of the present invention. In FIG. 4A, trench isolation 190 and optional well 240 are formed in a silicon substrate 270.

Figure 4B:
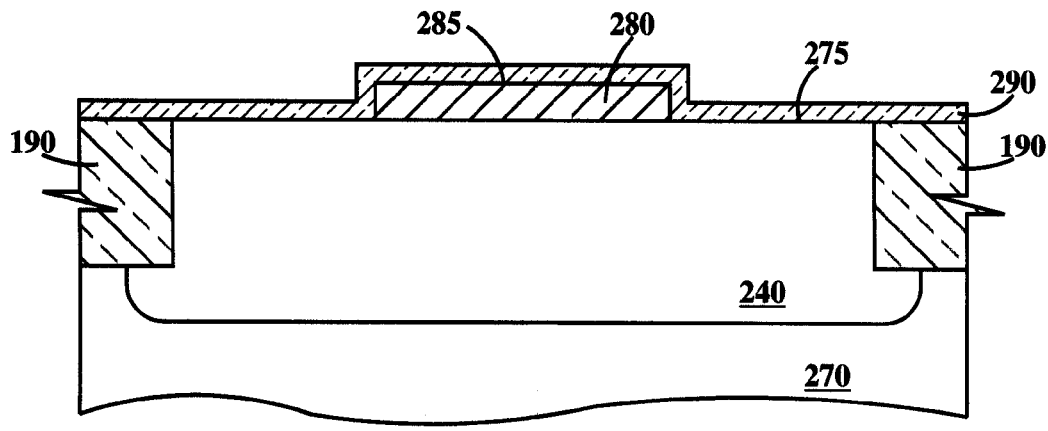

In FIG. 4B, a dummy gate 280 is formed on a top surface 275 of substrate 270 over optional well 240. In one example, dummy gate 280 comprises tungsten, hafnium, or tantalum or polysilicon. Dummy gate 280 should comprise a material resistant to the temperatures of subsequent oxidation and anneal processes. Dummy gate 280 may comprise several layers, for example a layer of silicon dioxide in contact with optional well 240 and a layer of tungsten over the oxide and, if desired, a silicon nitride cap. Dummy gate 280 may be encapsulated with a material to prevent oxidation of the dummy gate during subsequent oxidation processes. In one example, a silicon nitride layer is formed over all exposed surfaces of dummy gate 280 to protect the dummy gate from subsequent processing steps. In one example, dummy gate 280 has a thickness of between about 50 nm and about 300 nm. A hard mask layer 290 is formed on top surface 275 of substrate 270 and a top surface 285 of dummy gate 280. In one example, hard mask layer 290 is silicon dioxide or a layer of silicon nitride over a layer of silicon dioxide.

Figure 4C:
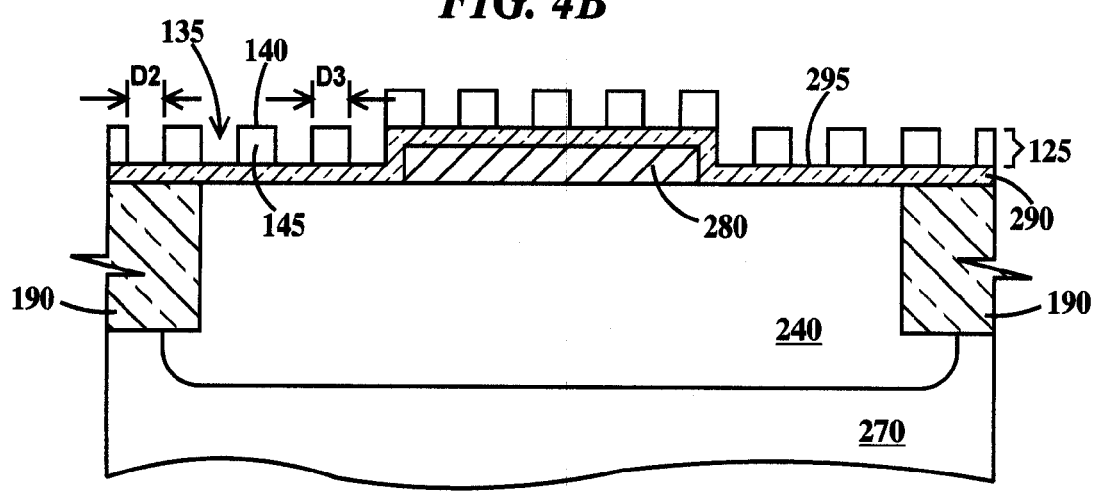

In FIG. 4C, nano-mask 125 is formed on a top surface 295 of silicon dioxide layer 290. Nano-mask layer 125 has been described supra in relationship to the first embodiment of the present invention.

Figure 4D:
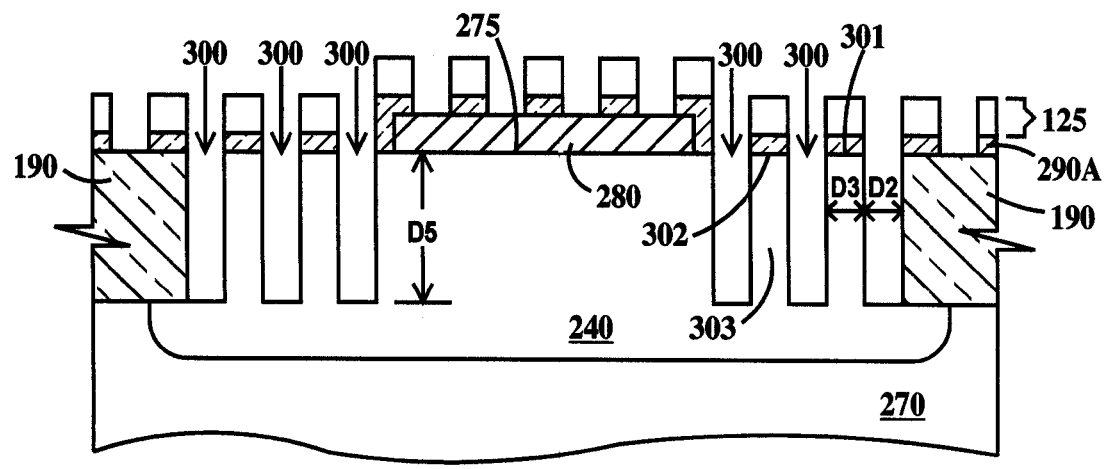

In FIG. 4D, silicon dioxide layer 290 (see FIG. 4C) is removed (for example by a RIE process) to form a patterned silicon dioxide layer 290A and exposing silicon substrate 270 wherever the silicon dioxide layer is not protected by nano-mask layer 125. Patterned silicon dioxide layer 290A comprises regions of silicon dioxide and void regions formed completely through patterned silicon dioxide layer 290A. The pattern and image dimensions of nano-mask layer 125 are transferred to patterned hard mask layer 290A.

Next, openings 300 are etched in silicon substrate 270 using, for example, a RIE process wherever silicon substrate 270 is not protected by patterned silicon dioxide layer 290A. Openings 300 may comprise voids surrounding islands of silicon or voids formed in silicon substrate 270. Patterned silicon dioxide layer 290A comprises void regions openings 300 extending from a top surface 275 of substrate 270 a distance D5 into the substrate and silicon regions 302. In a first example openings regions 300 are holes in a continuous solid region 302. In a second example, solid regions 302 are islands surrounded by openings region 300. Openings 300 have at least one spatial extent of dimension D2 in a direction parallel to top surface 301 of solid regions 302 and solid regions 302 have at least one spatial extent of dimension D3 in a direction parallel to top surface 301 of solid region 302. Values for D2 and D3 have been described supra. Openings 300 are etched to a depth D5. In one example D5 is between about 20 nm to about 300 nm. Optionally, the nano-mask layer 125 may be removed after etching hard mask layer 290 but before etching silicon substrate 270.

Figure 4E:
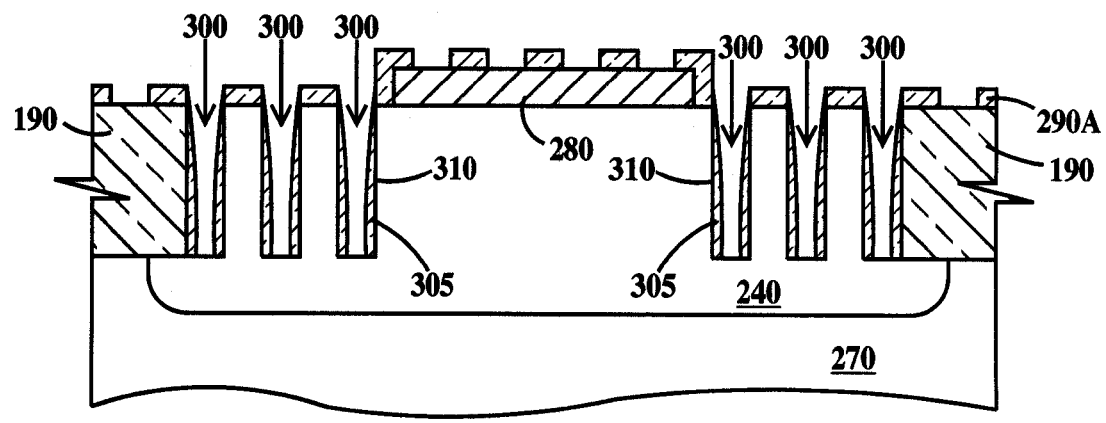
Figure 4F:
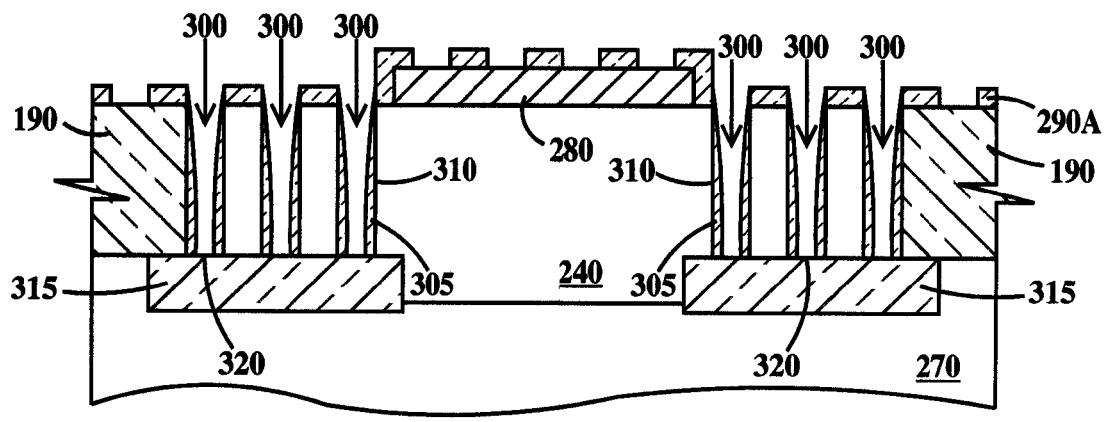

In FIG. 4E, nano-mask layer 125 (see FIG. 4D) has been removed and silicon nitride spacers 305 formed on sidewalls 310 of openings 300 and in FIG. 4F, a patterned buried oxide layer 315 is formed by thermal oxidation of silicon exposed at bottoms 320 of openings 300. In one example thermal oxidation is performed in an oxygen, water vapor or oxygen/water vapor atmosphere at about 1000° C. to about 1200° C. for about 5 minutes to about 60 minutes.

Figure 4G:
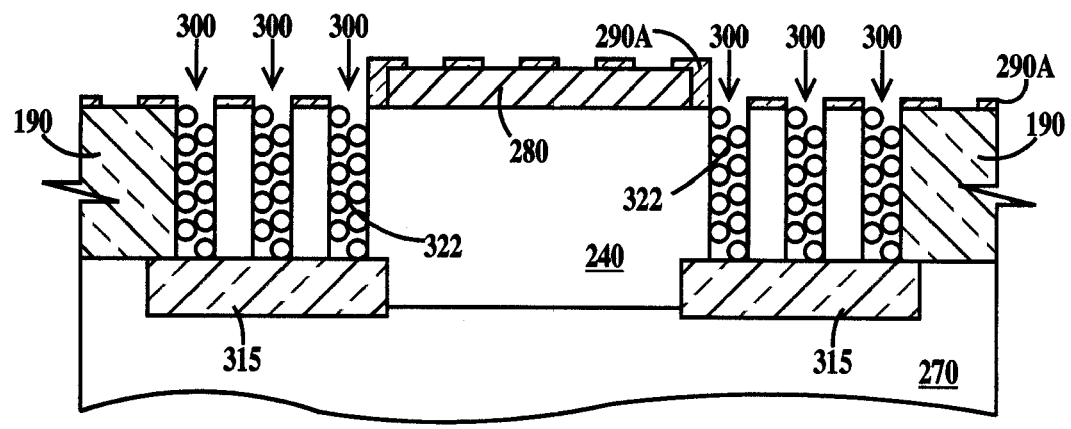

In FIG. 4G, silicon nitride spacers 305 (see FIG. 4F) are removed and epitaxial group IV semiconductor material selectively deposited in openings 300 forming an epitaxial or poly-group IV semiconductor nodules 322. Group IV semiconductor nodules 322 may comprise silicon, germanium or a mixture of silicon germanium denoted by the formula $Si_xGe_y$ where x=0 to 1 and y=1-x. When x=0, group IV semiconductor nodules 322 contain germanium but no silicon. When x=1, group IV semiconductor nodules 322 contain silicon but no germanium. A hydrogen anneal at about 850° C. is then performed in order to reflow silicon substrate 270 and the group IV semiconductor nodules 322. The anneal process also removes defects from buried oxide layer 315.

Figure 4H:
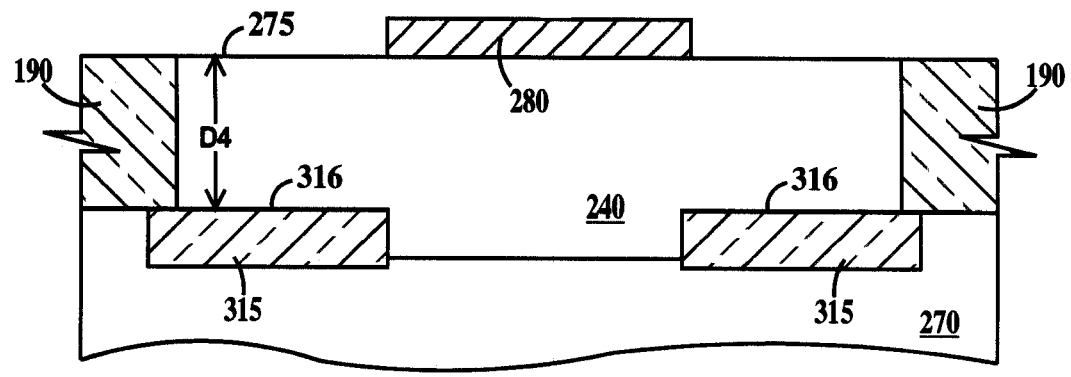
Figure 4I:
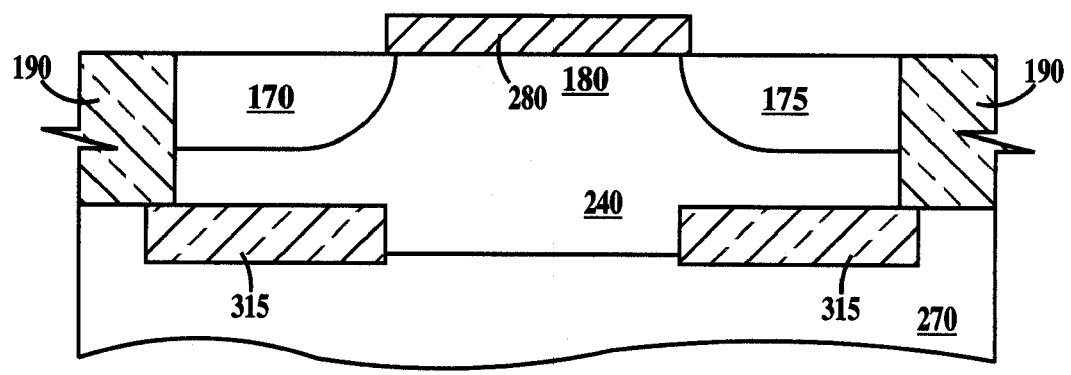

In FIG. 4H, the anneals performed supra relative to FIG. 4G result in group IV semiconductor nodules 322 (see FIG. 4G) and silicon substrate 270 coalescing into a single layer having the same single crystal structure as silicon substrate 270. If group IV semiconductor nodules 322 (see FIG. 4G) contained germanium, then the regions of substrate 270 between oxide layer 315 and top surface 275 of substrate 270 will contain silicon and germanium. Any remaining traces of patterned hard mask layer 290A (see FIG. 4G) are removed and in FIG. 4I, source 170, drain 175 are formed, for example, by ion implantation, and channel region 180 thus defined. A top surface 316 of patterned buried oxide layer 315 is a distance D4 below top surface 275 of substrate 270. In one example D4 is about 20 nm to about 300 nm. It should be noted that buried oxide layer 315 does not extend appreciably under dummy gate 280.

Figure 4J:
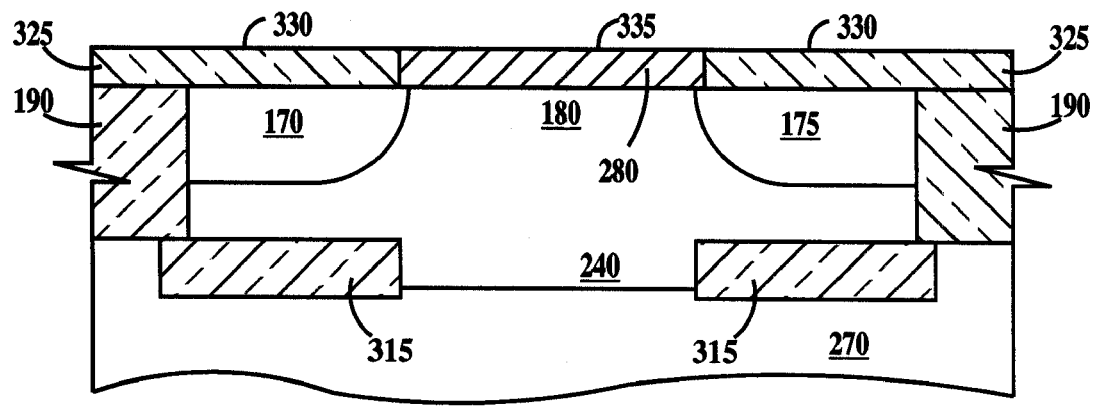

In FIG. 4J, a silicon dioxide layer 325 is blanket deposited and a CMP process performed to co-planarize a top surface 330 of silicon dioxide layer 325 and a (new) top surface 335 of dummy gate 280.

Figure 4K:
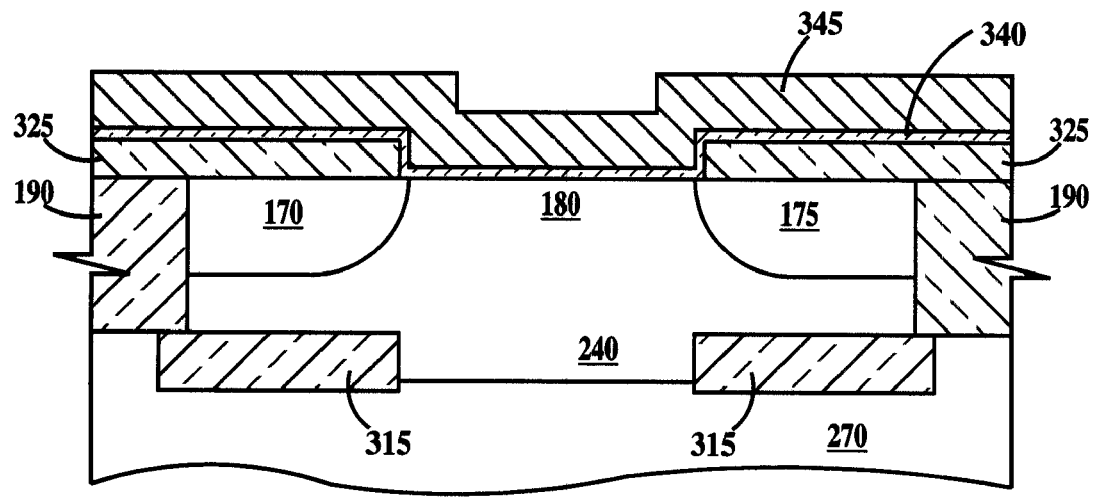

In FIG. 4K, dummy gate 280 (see FIG. 4J) is removed and a gate dielectric layer 340 is deposited, followed by deposition of a gate conductor layer 345. Alternatively a thin gate oxide may be thermally grown instead of depositing a gate dielectric.

Figure 4L:
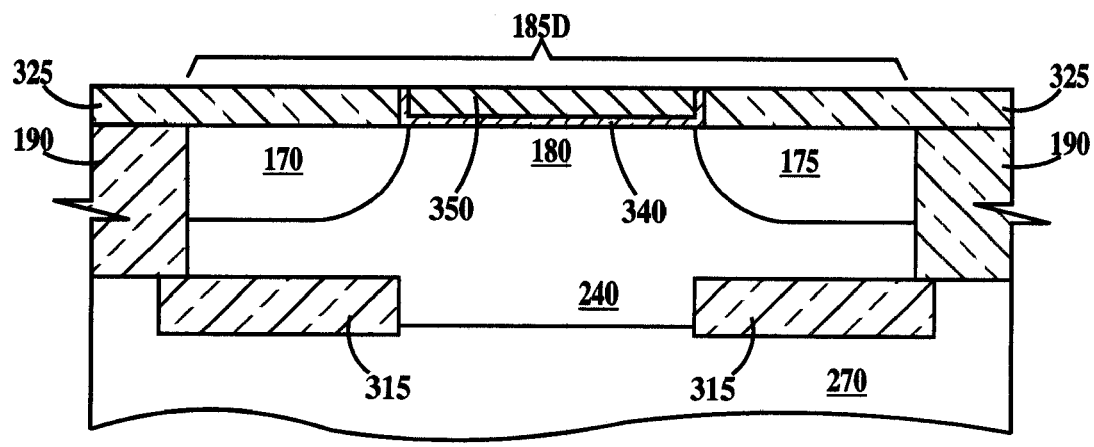

In FIG. 4L, gate conductor layer 345 and gate dielectric layer 340 (see FIG. 4K) have been subjected to a CMP process to form a gate electrode 350. A FET 185D comprising source 170, drain 175, channel 180, gate dielectric 340 and gate electrode 350 has thus been fabricated. The openings in buried oxide layer 315 allow direct contact between silicon layer channel region 180 and substrate 270, thus providing improved cooling and body potential control of FET 185D. It should be noted that buried oxide layer 315 may extend partially under gate electrode 200.

Figure 5A:
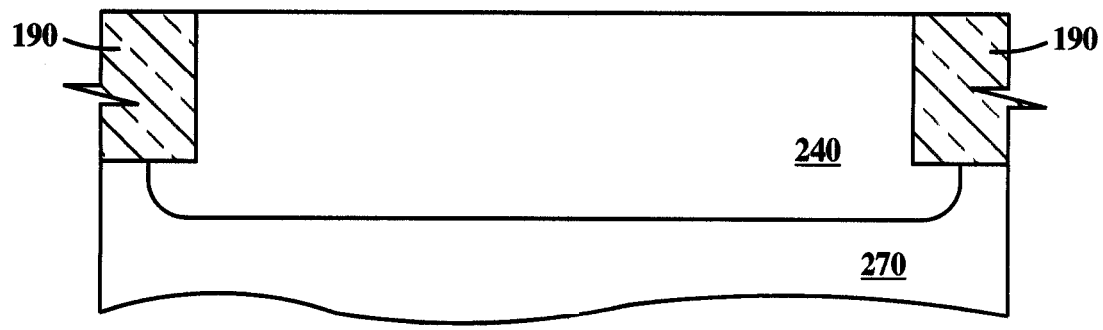
FIGS. 5A through 5J are partial cross-sectional views illustrating the steps to form a buried isolation region in a semiconductor device in a semiconductor substrate according to a fifth embodiment of the present invention.

FIGS. 5A through 5J are partial cross-sectional views illustrating the steps to form a buried isolation region in a semiconductor device in a semiconductor substrate according to a fifth embodiment of the present invention. In FIG. 5A, trench isolation 190 and optional well 240 are formed in a silicon substrate 270.

Figure 5B:
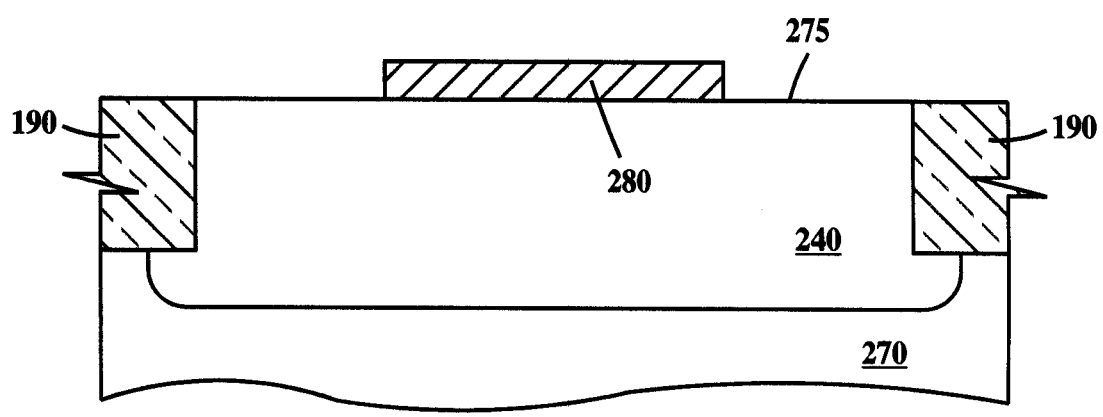

In FIG. 5B, dummy gate 280 is formed on a top surface 275 of substrate 270 over optional well 240. In one example, dummy gate 280 comprises tungsten, hafnium, tantalum or polysilicon. Dummy gate 280 has been described supra, in reference to the fourth embodiment of the present invention. Dummy gate 280 may be encapsulated as well. In one example, a silicon nitride layer is formed over all exposed surfaces of dummy gate 280 to protect the dummy gate from subsequent processing steps.

Figure 5C:
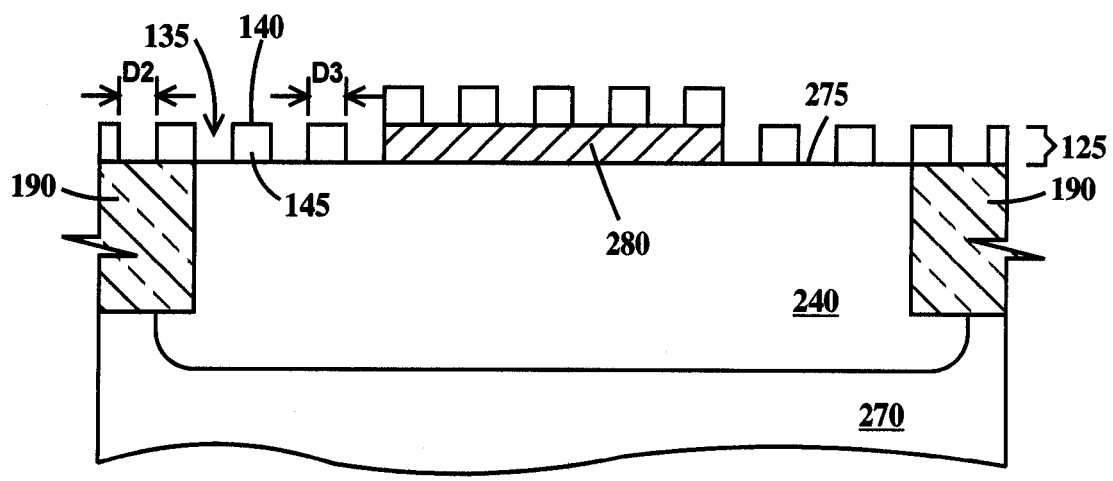

In FIG. 5C, nano-mask 125 is formed on a top surface 295 of silicon dioxide layer 290. Nano-mask layer 125 has been described supra in relationship to the first embodiment of the present invention.

Figure 5D:
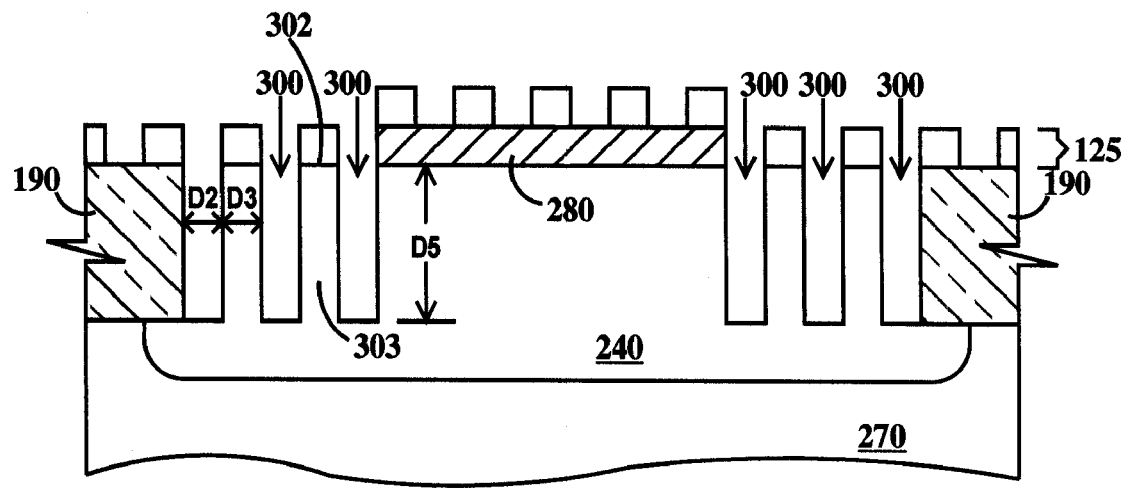

In FIG. 5D, openings 300 are etched in silicon substrate 270 using, for example, a RIE process wherever silicon substrate 270 is not protected by patterned nano-mask layer 290A. Alternatively, a hard mask layer may be used as in the fourth embodiment of the present invention to transfer nano-mask 125 pattern to silicon substrate 270. In a first example openings regions 300 are holes in a continuous solid region 302. In a second example, solid regions 302 are islands surrounded by openings region 300. Openings regions 300 have at least one spatial extent of dimension D2 in a direction parallel to top surface 301 of solid regions 302 and solid regions 302 have at least one spatial extent of dimension D3 in a direction parallel to top surface 301 of solid region 302. Values for D2 and D3 have been described supra. Openings 300 are etched to a depth D5. In one example D5 is between about 20 nm to about 300 nm.

Figure 5E:
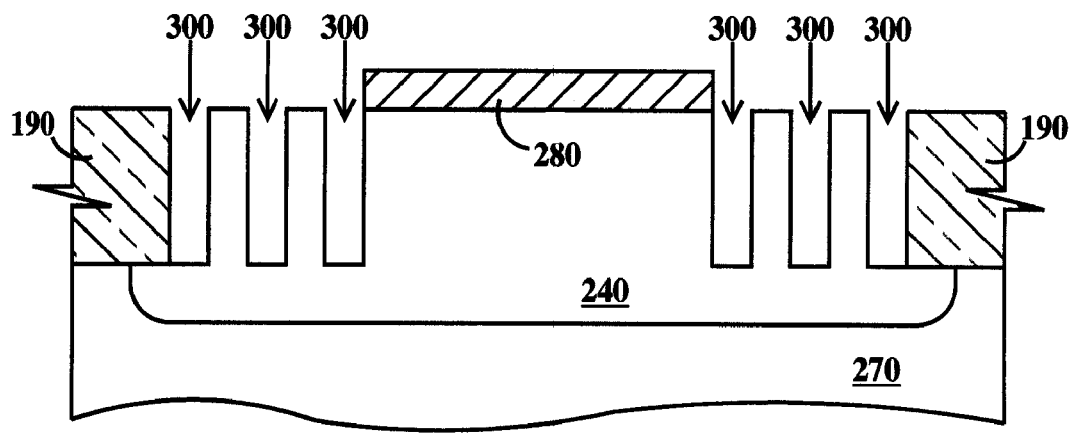

Next, in FIG. 5E, nano-mask layer 125 (see FIG. 5D) is removed.

Figure 5F:
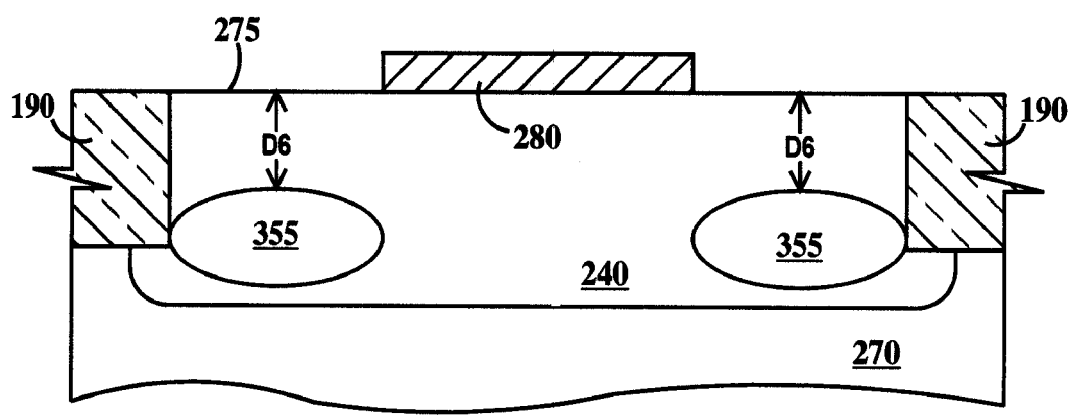

In FIG. 5F, a hydrogen anneal at about 1100° C. is performed which cause the silicon substrate to flow and openings 300 (see FIG. 5E) to coalesce into voids 355 located on either side of dummy gate 280 a distance D6 from top surface 275 of silicon substrate 270. In one example, D6 is about 20 nm to about 250 nm. While each void 355 are illustrated as a single cavity, each void 355 may comprise a void region (i.e. a group of adjacent individual cavities separated from one another by thin walls of silicon some of which cavities may be interconnected).

Figure 5G:
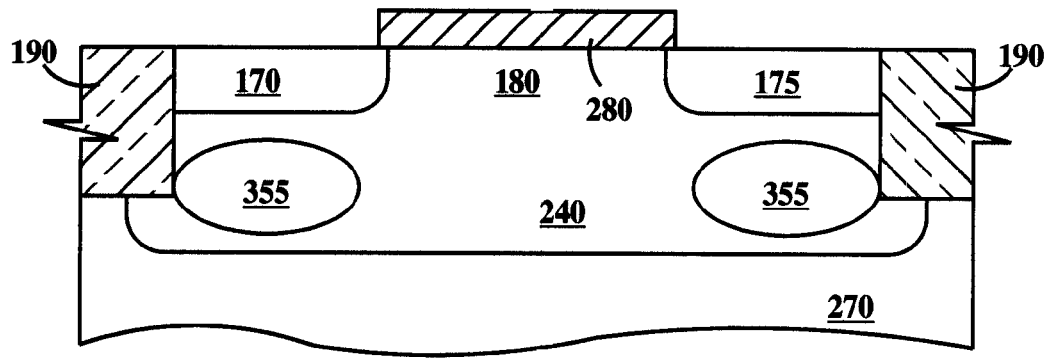

In FIG. 5G, source 170, drain 175 are formed, for example, by ion implantation, and channel region 180 thus defined. It should be noted that voids 355 do not extend appreciably under dummy gate 280.

Figure 5H:
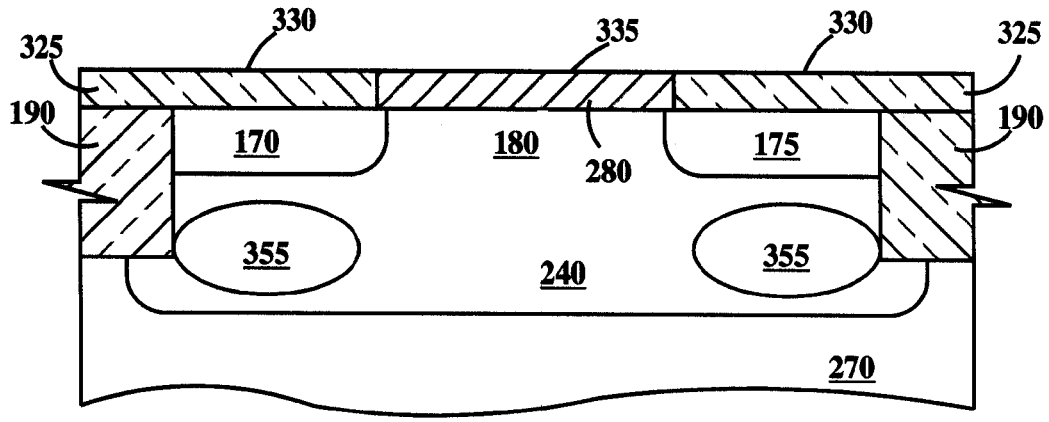

In FIG. 5H, silicon dioxide layer 325 is blanket deposited and a CMP process performed to co-planarize top surface 330 of a silicon dioxide layer 325 and (new) top surface 335 of dummy gate 280.

Figure 5I:
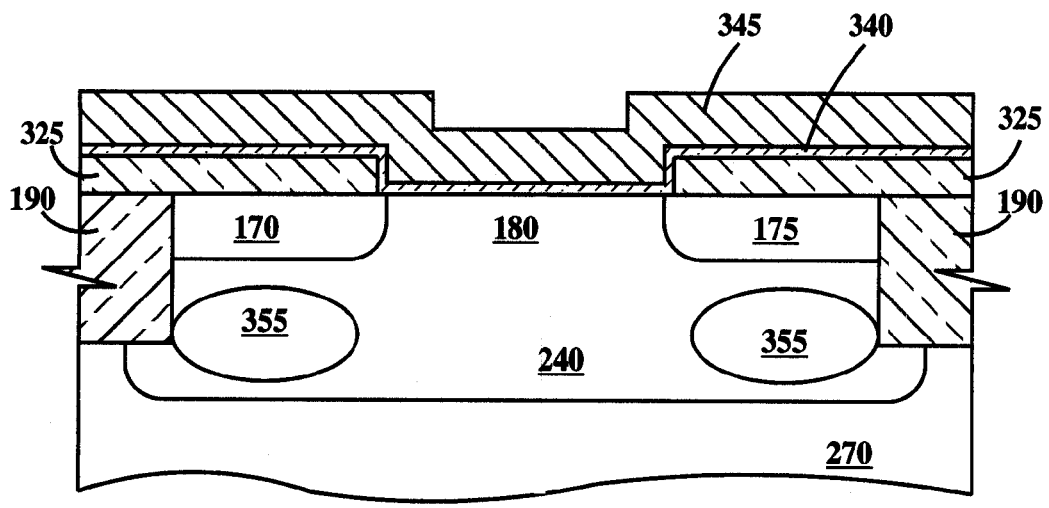

In FIG. 5I, dummy gate 280 (see FIG. 5H) is removed and gate dielectric layer 340 is deposited, followed by deposition of gate conductor layer 345. Alternatively a thin gate oxide may be thermally grown instead of depositing a gate dielectric.

Figure 5J:
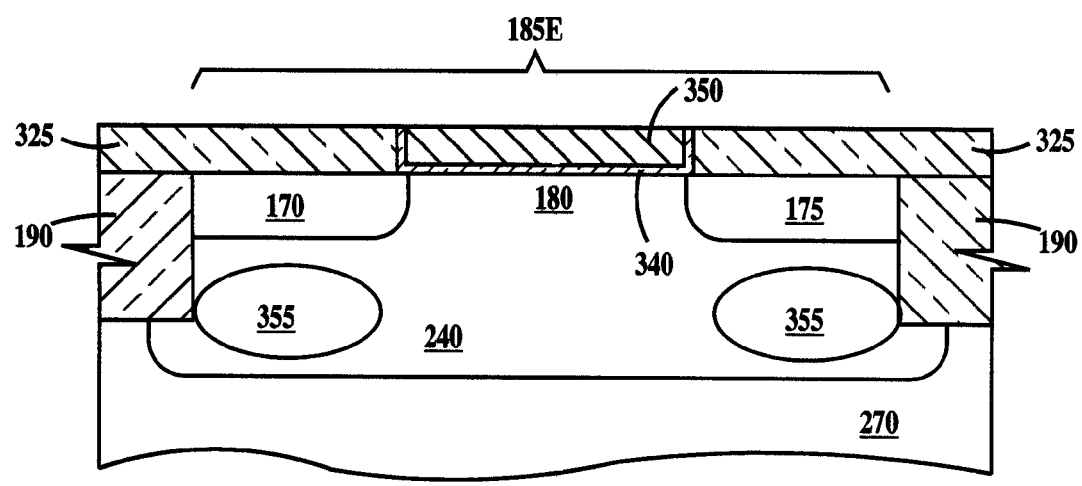

In FIG. 5J, gate conductor layer 345 and gate dielectric layer 340 (see FIG. 5I) have been subjected to a CMP process to form gate electrode 350. An FET 185E comprising source 170, drain 175, channel 180, gate dielectric 340 and gate electrode 350 has thus been fabricated. The space between voids 355 allow direct contact between silicon layer channel region 180 and substrate 270, thus providing improved cooling of FET 185E. Additionally, there are no buried oxide defects to contend with. It should be noted that voids 355 may extend partially under gate electrode 350.

Thus, the present invention provides improved methods of forming buried isolation regions in semiconductor substrates and for methods of forming semiconductor devices with buried isolation and still provide cooling and control of body potential of the devices.

The description of the embodiments of the present invention is given above for the understanding of the present invention. It will be understood that the invention is not limited to the particular embodiments described herein, but is capable of various modifications, rearrangements and substitutions as will now become apparent to those skilled in the art without departing from the scope of the invention. Therefore, it is intended that the following claims cover all such modifications and changes as fall within the true spirit and scope of the invention.

What is claimed is:

1. A method of forming a semiconductor structure, comprising:
    (a) providing a single crystal silicon substrate;
    (b) forming a hard mask layer on a top surface of said substrate;
    (c) forming a nano-mask layer on a top surface of said hard mask layer without performing a photolithographic process, said nano-mask layer having a masking pattern;
    (d) etching said masking pattern into said hard mask layer to form a patterned hard mask layer having openings, said openings extending from a top surface of said patterned hard mask layer to said top surface of said substrate, wherein said openings, distances between said openings, or both said openings and said distances between said openings independently have at least one spatial extent extending parallel to said top surface of said patterned hard mask layer; and
    (e) after removing said nano-mask layer, forming a single crystal group IV semiconductor layer on a top surface of said patterned hard mask layer, said single crystal group IV semiconductor layer filling said openings in said patterned hard mask layer.

2. The method of claim 1, wherein said single crystal group IV semiconductor layer is formed by depositing epitaxial silicon, epitaxial germanium or an epitaxial mixture of silicon and germanium.

3. The method of claim 1, further including:
    (f) annealing said group IV semiconductor layer.

4. The method of claim 1, further including:
    (f) performing a chemical-mechanical-polish to planarize a top surface of said single crystal group IV semiconductor layer.

5. The method of claim 1, wherein patterned hard mask layer comprises islands of hard mask or said openings are holes in said patterned hard mask layer.

6. The method of claim 1, wherein a top surface of said patterned hard mask layer is between about 20 nanometers to about 300 nanometers below a top surface of said single crystal group IV semiconductor layer.

7. The method of claim 1, wherein said nano-mask layer comprises a layer of block copolymer comprising two or more different polymers from which all or a portion of one of said polymers has been removed.

8. The method of claim 1, wherein said nano-mask layer comprises nano-crystals.

9. The method of claim 1, further including:
    forming a gate dielectric on a top surface of said single crystal group IV semiconductor layer;
    forming a gate electrode on a top surface of said gate dielectric; and
    forming a source and a drain in said single crystal group IV semiconductor layer on opposite sides of said gate electrode.

10. The method of claim 9, further including:
    between steps (b) and (c), forming a protective layer on said top surface of said hard mask layer over regions of said single crystal group IV semiconductor layer reserved for formation of said source and said drain, said protective layer preventing transferring of said masking pattern into said hard mask layer.

11. The method of claim 1, wherein said at least one spatial extent is between about 2 nanometers and about 100 nanometers.

12. The method of claim 1, wherein said single crystal group IV semiconductor layer comprises $Si_xGe_y$, where x=0 to 1 and y=x-1.

13. A method of forming a semiconductor structure, comprising:
(a) providing a single crystal silicon substrate;
(b) forming a dummy gate on a top surface of said substrate;
(c) forming a nano-mask layer on a top surface of said substrate and on a top surface of said dummy gate without performing a photolithographic process, said nano-mask layer having a masking pattern;
(d) etching said masking pattern into said substrate wherever said substrate is not covered by said dummy gate to form a patterned silicon region having openings in said substrate, said openings extending from a top surface of said substrate a predetermined distance into said substrate, wherein said openings, distances between said openings, or both said openings and said distances between said openings independently have at least one spatial extent extending parallel to said top surface of said patterned layer;
(e) after removing said nano-mask layer, forming a protective layer on said top surface of said substrate and on sidewalls of said openings;
(f) oxidizing said substrate exposed in bottoms of said openings to form a buried patterned silicon dioxide layer;
(g) removing said protective layer from said sidewalls of said openings; and
(h) filling said openings with a single crystal group IV semiconductor material.

14. The method of claim 13, wherein step (h) includes selectively depositing poly-$Si_xGe_y$, where x=0 to 1 and y=x-1, in said openings and annealing said $Si_xGe_y$.

15. The method of claim 13, wherein said openings are filled with single crystal $Si_xGe_y$, where x=0 to 1 and y=x-1, by depositing epitaxial $Si_xGe_y$ into said opening.

16. The method of claim 13, wherein said patterned silicon region comprises islands of silicon or said openings are holes in said patterned silicon region.

17. The method of claim 13, wherein a top surface of said buried patterned silicon dioxide layer is between about 20 nanometers to about 300 nanometers below a top surface of said substrate.

18. The method of claim 13, wherein said nano-mask layer comprises a layer of block copolymer comprising two or more different polymers from which all or a portion of one of said polymers has been removed.

19. The method of claim 13, wherein said nano-mask layer comprises nano-crystals.

20. The method of claim 13, further including:
forming a source and a drain on opposite sides of said dummy gate in said substrate;
forming a planarizing layer on said dummy gate and on said top surface of said substrate not covered by said dummy gate;
co-planarizing a top surface of said planarizing layer and a top surface of said dummy gate;
removing said dummy gate;
forming a gate dielectric on a top surface of said substrate exposed by removal of said dummy gate; and
forming a gate electrode on a top surface of said gate dielectric, said gate electrode self aligned to said source and said drain.

21. The method of claim 20 wherein said buried patterned silicon dioxide layer extends under said source and said drain.

22. The method of claim 20, wherein said buried patterned silicon dioxide layer does not extend completely under said gate electrode.

23. The method of claim 13, further including:
before step (a) forming an oxygen rich layer buried in said substrate.

24. The method of claim 23, wherein said openings extend from said top surface of said substrate to said oxygen rich layer.

25. The method of claim 13, wherein said at least one spatial extant is between about 2 nanometers and about 100 nanometers.

26. The method of claim 13, wherein said single crystal group IV semiconductor material comprises $Si_xGe_y$, where x=0 to 1 and y=x-1.

27. A method of forming a semiconductor structure, comprising:
(a) providing a single crystal silicon substrate;
(b) forming a dummy gate on a top surface of said substrate;
(c) forming a nano-mask layer on a top surface of said substrate and on a top surface of said dummy gate without performing a photolithographic process, said nano-mask layer having a masking pattern;
(d) etching said masking pattern into said substrate wherever said substrate is not covered by said dummy gate to form openings in said substrate, said openings extending from a top surface of said substrate a predetermined distance into said substrate, wherein said openings, distances between said openings, or both said openings and said distances between said openings independently have at least one spatial extent extending parallel to said top surface of said patterned layer; and
(e) annealing said substrate to reflow silicon adjacent to said top surface of said substrate, sealing off said openings from said top surface of said substrate and coalescing said openings into buried voids.

28. The method of claim 27, wherein top surfaces of said buried voids are between about 20 nanometers to about 300 nanometers below a top surface of said substrate.

29. The method of claim 27, wherein said nano-mask layer comprises a layer of block copolymer comprising two or more different polymers from which all or a portion of one of said polymers has been removed.

30. The method of claim 27, wherein said nano-mask layer comprises nano-crystals.

31. The method of claim 27, further including:
forming a source and a drain on opposite sides of said dummy gate in said substrate;
forming a planarizing layer on said dummy gate and on said top surface of said substrate not covered by said dummy gate;
co-planarizing a top surface of said planarizing layer and a top surface of said dummy gate;
removing said dummy gate;
forming a gate dielectric on a top surface of said substrate exposed by removal of said dummy gate; and
forming a gate electrode on a top surface of said gate dielectric, said gate electrode self aligned to said source and said drain.

32. The method of claim 31, wherein said one or more buried voids extend under said source and one or more buried voids extend under said drain.

33. The method of claim 31, wherein said buried voids do not extend completely under said gate electrode.

34. The method of claim 31, wherein said at least one spatial extent is between about 2 nanometers and about 100 nanometers.

* * * * *

UNITED STATES PATENT AND TRADEMARK OFFICE
CERTIFICATE OF CORRECTION

| | | |
|---|---|---|
| PATENT NO. | : 7,071,047 B1 | Page 1 of 1 |
| APPLICATION NO. | : 10/905980 | |
| DATED | : July 4, 2006 | |
| INVENTOR(S) | : Furukawa et al. | |

It is certified that error appears in the above-identified patent and that said Letters Patent is hereby corrected as shown below:

Column 4
Line 24, delete "the"

Column 11
Line 45, delete "An" and insert -- A --

Column 14
Line 15, delete "extant" and insert -- extent --

Signed and Sealed this

Twenty-third Day of January, 2007

JON W. DUDAS
*Director of the United States Patent and Trademark Office*